United States Patent
Yang et al.

(10) Patent No.: US 10,873,345 B2
(45) Date of Patent: Dec. 22, 2020

(54) ENHANCED POLAR CODE CONSTRUCTION

(71) Applicant: QUALCOMM Incorporated, San Diego, CA (US)

(72) Inventors: Wei Yang, San Diego, CA (US); Ying Wang, San Diego, CA (US); Jing Jiang, San Diego, CA (US); Yang Yang, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 144 days.

(21) Appl. No.: 16/267,007

(22) Filed: Feb. 4, 2019

(65) Prior Publication Data

US 2019/0245560 A1    Aug. 8, 2019

Related U.S. Application Data

(60) Provisional application No. 62/626,433, filed on Feb. 5, 2018.

(51) Int. Cl.
*H03M 13/13* (2006.01)
*H03M 13/11* (2006.01)
(Continued)

(52) U.S. Cl.
CPC ......... *H03M 13/13* (2013.01); *H03M 13/033* (2013.01); *H03M 13/1125* (2013.01);
(Continued)

(58) Field of Classification Search
None
See application file for complete search history.

(56) References Cited

U.S. PATENT DOCUMENTS 10,594,438 B2 * 3/2020 Shelby ............... H04L 1/007
2019/0044540 A1 * 2/2019 Jiang ................ H04L 1/0069
(Continued)

OTHER PUBLICATIONS

Huawei et al., "Analysis of the Sequence of Polar Codes" 3GPP Draft, R1-1708157 Analysis of the Sequence for Polar Codes, 3rd Generation Partnership Project (3GPP), Mobile Competence Centre, 650, Route Des Lucioles , F-06921 Sophia-Antipolis Cedex, France, vol. RAN WG1, No. Hangzhou, China, May 15, 2017-May 19, 2017, May 14, 2017 (May 14, 2017), 9 Pages, XP051273353, Retrieved from the Internet: URL: http://www.3gpp.org/ftp/Meetings_3GPP_SYNC/RAN1/Docs/ [retrieved on May 14, 2017], Section 2.3.

(Continued)

*Primary Examiner* — Justin R Knapp
(74) *Attorney, Agent, or Firm* — Holland & Hart LLP

(57) ABSTRACT

Methods, systems, and devices for wireless communications are described. An encoder of a wireless device may receive a number of information bits and a block size for transmission. If the block size is not a power of two, the encoder may round the block size up to the nearest power of 2, generate a larger codeword, and puncture the excess bits. The punctured bits may affect a rate of polarization when generating a polar code, and sub-blocks with a high number of punctured bits may produce too few sufficiently polarized channels. The encoder may implement a capacity backoff when polar coding to identify a greater number of polarized channels. The encoder may assign information bits to sufficiently polarized channels of the greater number of polarized channels.

31 Claims, 15 Drawing Sheets

(51) Int. Cl.
H03M 13/00 (2006.01)
H04L 1/00 (2006.01)
H03M 13/03 (2006.01)

(52) U.S. Cl.
CPC ... H03M 13/1137 (2013.01); H03M 13/6362 (2013.01); H04L 1/0057 (2013.01); H04L 1/0068 (2013.01)

(56) References Cited

U.S. PATENT DOCUMENTS

2019/0181979 A1* 6/2019 Wang .................. H04L 1/0068
2020/0204197 A1* 6/2020 Maunder ........... H03M 13/6362

OTHER PUBLICATIONS

International Search Report and Written Opinion—PCT/US2019/016645—ISA/EPO—dated Apr. 17, 2019.

QUALCOMM Incorporated: "FRANK Polar Construction: Nested Extension Design of Polar Codes Based on Mutual Information" 3GPP Draft, R1-1706130 FRANK Polar Construction Nested Extension Design of Polar Codes Based on Mutual Information , 3rd Generation Partnership Project (3GPP), Mobile Competence Centre, 650, Route Des, vol. RAN WG1, No. Spokane, USA, Apr. 3, 2017-Apr. 7, 2017, Mar. 30, 2017 (Mar. 30, 2017), 24 Pages, XP051252420, Retrieved from the Internet: URL:http://www.3gpp.org/ftp/tsg_ran/WG1_RL1/TSGR1_88b/Docs/ [retrieved on Mar. 30, 2017], Section 3.3, Appendix A, Appendix B.

QUALCOMM Incorporated: "Frank Polar Construction for NR Control Channel and Performance Comparison," 3GPP Draft; R1-1709178 Frank Polar Construction for NR Control Channel and Performance Comparison, 3rd Generation Partnership Project (3GPP), Mobile Competence Centre; 650, Route Des Lucioles; F-069, vol. RAN WG1, No. Hangzhou; May 15, 2017-May 19, 2017, May 17, 2017, XP051285058, 27 Pgaes, Retrieved from the Internet: URL: http://www.3gpp.org/ftp/tsg_ran/WG1_RL1/TSGR1_89/Docs/ [retrieved on May 17, 2017].

* cited by examiner

ENHANCED POLAR CODE CONSTRUCTION

CROSS REFERENCES

The present Application for Patent claims the benefit of U.S. Provisional Patent Application No. 62/626,433 by YANG, et al., entitled "ENHANCED POLAR CODE CONSTRUCTION," filed Feb. 5, 2018, assigned to the assignee hereof, and expressly incorporated herein.

BACKGROUND

The following relates generally to wireless communication, and more specifically to enhanced polar code construction.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

An encoder of a wireless device may identify a number of information bits for encoding and a block size for transmitting the encoded bits. If the block size is not a power of two, the encoder may round the block size up to the nearest power of two, generating a larger codeword. In some cases, excess bits may be punctured. Punctured bits may affect bit-channel polarization, which may present challenges in determining the most reliable bit-channels of the polar code.

SUMMARY

The described techniques relate to improved methods, systems, devices, or apparatuses that support enhanced FRActally eNhanced Kernel (FRANK) polar code construction for achievable signal-to-noise ratio (SNR) spike mitigation. Generally, the described techniques may provide means for a wireless device (e.g., a base station or user equipment (UE)) to implement enhanced FRANK polar code construction. In some cases, enhanced FRANK polar code construction may address different reliability requirements for a device. For example, the device may need to implement different polar coding constructions to achieve a specified block error ratio (BLER) target value. An encoder of the wireless device may receive (e.g., from a data source) a number of information bits to transmit within a specified block size and may further select bit-channels of a polar code for encoding the information bits based on for example, the information bits and block size. Depending on the specified block size, the encoder may generate a larger codeword and may puncture excess bits not in the original block size. The encoder may then perform a bit allocation procedure to determine how to assign the information bits to input bit-channels of the polar code. The encoder may split the output bit-channels into a first sub-block and a second sub-block in a first polarization stage. The first sub-block may include a high number of punctured bits, and may polarize slower than the second sub-block, which may not include any punctured bits. This may result in the wireless device selecting bit-channels which are not sufficiently polarized and therefore unreliable. To compensate for different rates of polarization, the encoder may apply a capacity backoff to identify a number of bit-channels for the information bits that are the most reliable (e.g., the information bits estimated or approximated to be the most reliable). In some cases, the encoder may perform the allocation process only at the first polarization stage using a predetermined order within each sub-block of the first polarization stage. Alternatively, the encoder may perform the allocation process recursively. The recursive process may halt when the length of the sub-blocks is less than or equal to a threshold sub-block size. In some cases, the encoder may perform the allocation process directly on base sub-blocks of the threshold sub-block size.

A method of wireless communication is described. The method may include receiving a signal representing a codeword over a wireless channel, the codeword being encoded using a polar code having a code length, identifying, in the signal, unpunctured bit-channels of the codeword, identifying a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based at on a capacity backoff function, and decoding the signal according to the polar code to obtain an information bit vector at the set of bit locations.

An apparatus for wireless communication is described. The apparatus may include means for receiving a signal representing a codeword over a wireless channel, the codeword being encoded using a polar code having a code length, means for identifying, in the signal, unpunctured bit-channels of the codeword, means for identifying a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, and means for decoding the signal according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a signal representing a codeword over a wireless channel, the codeword being encoded using a polar code having a code length, identify, in the signal, unpunctured bit-channels of the codeword, identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, and decode the signal according to the polar code to obtain an information bit vector at the set of bit locations.

A non-transitory computer-readable medium for wireless communication is described. The non-transitory computer-readable medium may include instructions operable to cause a processor to receive a signal representing a codeword over a wireless channel, the codeword being encoded using a polar code having a code length, identify, in the signal, unpunctured bit-channels of the codeword, identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, and decode the signal according to the polar code to obtain an information bit vector at the set of bit locations.

Some examples of the method, apparatus, and non-transitory computer-readable medium described herein may further include processes, features, means, or instructions for recursively partitioning each of the partitions allocated to each of the first bit-channel sub-blocks into sub-partitions allocated to second bit-channel sub-blocks of the first bit-channel sub-blocks based on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and where the respective second numbers of delta bits for each of the second bit-channel sub-blocks may be based on the capacity backoff function.

Some examples of the method, apparatus, and non-transitory computer-readable medium described herein may further include processes, features, means, or instructions for rounding the sub-partitions of a partition allocated to one of the first bit-channel sub-blocks to integer values having a sum equal to the number of information bits in the partition.

In some examples of the method, apparatus, and non-transitory computer-readable medium described herein, the first bit-channel sub-blocks include base sub-blocks and the number of delta bits for one of the first bit-channel sub-blocks may be determined based on a ratio of the capacity backoff function for the one of the first bit-channel sub-blocks to a sum of the capacity backoff function over all of the first bit-channel sub-blocks.

Some examples of the method, apparatus, and non-transitory computer-readable medium described herein may further include processes, features, means, or instructions for sequentially rounding each of the partitions of the number of information bits allocated to each of the first bit-channel sub-blocks. Some examples of the method, apparatus, and non-transitory computer-readable medium described herein may further include processes, features, means, or instructions for propagating a rounding error from each of the sequentially rounded partitions to a next partition for the sequentially rounding.

In some examples of the method, apparatus, and non-transitory computer-readable medium described herein, a sequence for the sequentially rounding includes a permutation of sub-block indices for the first bit-channel sub-blocks that determines an order of the sequentially rounding.

Some examples of the method, apparatus, and non-transitory computer-readable medium described herein may further include processes, features, means, or instructions for recursively rounding aggregates of the partitions of the number of information bits from an initial polarization stage of the polar code to a polarization stage of the polar code associated with the base sub-blocks.

Some examples of the method, apparatus, and non-transitory computer-readable medium described herein may further include processes, features, means, or instructions for determining the initial capacity for the mutual information transfer function based on a sum of a rate of the polar code and the capacity backoff function evaluated for the rate of the polar code and a number of the unpunctured bit-channels of the codeword.

In some examples of the method, apparatus, and non-transitory computer-readable medium described herein, the number of information bits may be divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks.

In some examples of the method, apparatus, and non-transitory computer-readable medium described herein, the partitions of the information bits assigned to the first bit-channel sub-blocks may be assigned to bit-channels of the first bit-channel sub-blocks in a predetermined order.

In some examples of the method, apparatus, and non-transitory computer-readable medium described herein, the capacity backoff function may be a closed-form function.

In some examples of the method, apparatus, and non-transitory computer-readable medium described herein, a ratio of the respective numbers of delta bits for the first bit-channel sub-blocks may be proportional to the capacity backoff function evaluated for the first bit-channel sub-blocks over the respective numbers of unpunctured bit locations in the first bit-channel sub-blocks and the respective aggregate capacities of the first bit-channel sub-blocks.

In some examples of the method, apparatus, and non-transitory computer-readable medium described herein, the set of bit locations of the polar code used for information bits for the encoding may be identified based on a table that indicates information bit allocations for at least one of different lengths of the polar code, different numbers of information bits, different numbers of punctured bits, or different block error rate (BLER) target values.

A method of wireless communication is described. The method may include identifying an information bit vector for encoding using a polar code to obtain a codeword, identifying unpunctured bit-channels of the codeword, identifying a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based at least in part on a capacity backoff function, encoding the information bit vector mapped to the set of bit locations using the polar code to obtain the codeword, and transmitting the codeword over a wireless channel.

An apparatus for wireless communication is described. The apparatus may include means for identifying an information bit vector for encoding using a polar code to obtain a codeword, means for identifying unpunctured bit-channels of the codeword, means for identifying a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based at least in part on a capacity backoff function, means for encoding the information bit vector mapped to the set of bit locations using the polar code to obtain the codeword, and means for transmitting the codeword over a wireless channel.

Another apparatus for wireless communication is described. The apparatus may include a processor, memory in electronic communication with the processor, and instructions stored in the memory. The instructions may be operable to cause the processor to identify an information bit vector for encoding using a polar code to obtain a codeword, identify unpunctured bit-channels of the codeword, identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, encode the information bit vector mapped to the set of bit locations using the polar code to obtain the codeword, and transmit the codeword over a wireless channel.

A non-transitory computer-readable medium for wireless communication is described. The non-transitory computer-readable medium may include instructions operable to cause a processor to identify an information bit vector for encoding using a polar code to obtain a codeword, identify unpunctured bit-channels of the codeword, identify a set of bit locations of the polar code used for information bits for the encoding, where the set of bit locations is determined based at least in part on dividing a number of the information bits into partitions allocated to first bit-channel sub-blocks for at least one stage of polarization of the polar code, where the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, encode the information bit vector mapped to the set of bit locations using the polar code to obtain the codeword, and transmit the codeword over a wireless channel.

Some examples of the method, apparatus, and non-transitory computer-readable medium described herein may further include processes, features, means, or instructions for recursively partitioning each of the partitions allocated to each of the first bit-channel sub-blocks into sub-partitions allocated to second bit-channel sub-blocks of the first bit-channel sub-blocks based on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and where the respective second numbers of delta bits for each of the second bit-channel sub-blocks may be based on the capacity backoff function.

Some examples of the method, apparatus, and non-transitory computer-readable medium described herein may further include processes, features, means, or instructions for rounding the sub-partitions of a partition allocated to one of the first bit-channel sub-blocks to integer values having a sum equal to the number of information bits in the partition.

In some examples of the method, apparatus, and non-transitory computer-readable medium described herein, the first bit-channel sub-blocks include base sub-blocks and the number of delta bits for one of the first bit-channel sub-blocks may be determined based on a ratio of the capacity backoff function for the one of the first bit-channel sub-blocks to a sum of the capacity backoff function over all of the first bit-channel sub-blocks.

Some examples of the method, apparatus, and non-transitory computer-readable medium described herein may further include processes, features, means, or instructions for sequentially rounding each of the partitions of the number of information bits allocated to each of the first bit-channel sub-blocks. Some examples of the method, apparatus, and non-transitory computer-readable medium described herein may further include processes, features, means, or instructions for propagating a rounding error from each of the sequentially rounded partitions to a next partition for the sequentially rounding.

In some examples of the method, apparatus, and non-transitory computer-readable medium described herein, a sequence for the sequentially rounding includes a permutation of sub-block indices for the first bit-channel sub-blocks that determines an order of the sequentially rounding.

Some examples of the method, apparatus, and non-transitory computer-readable medium described herein may further include processes, features, means, or instructions for recursively rounding aggregates of the partitions of the number of information bits from an initial polarization stage of the polar code to a polarization stage of the polar code associated with the base sub-blocks.

Some examples of the method, apparatus, and non-transitory computer-readable medium described herein may further include processes, features, means, or instructions for determining the initial capacity for the mutual information transfer function based on a sum of a rate of the polar code and the capacity backoff function evaluated for the rate of the polar code and a number of the unpunctured bit-channels of the codeword.

In some examples of the method, apparatus, and non-transitory computer-readable medium described herein, the number of information bits may be divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks.

In some examples of the method, apparatus, and non-transitory computer-readable medium described herein, the partitions of the information bits assigned to the first bit-channel sub-blocks may be assigned to bit-channels of the first bit-channel sub-blocks in a predetermined order.

In some examples of the method, apparatus, and non-transitory computer-readable medium described herein, the capacity backoff function may be a closed-form function.

In some examples of the method, apparatus, and non-transitory computer-readable medium described herein, a ratio of the respective numbers of delta bits for the first bit-channel sub-blocks may be proportional to the capacity backoff function evaluated for the first bit-channel sub-blocks over the respective numbers of unpunctured bit locations in the first bit-channel sub-blocks and the respective aggregate capacities of the first bit-channel sub-blocks.

In some examples of the method, apparatus, and non-transitory computer-readable medium described herein, the set of bit locations of the polar code used for information bits for the encoding may be identified based on a table that indicates information bit allocations for at least one of different lengths of the polar code, different numbers of information bits, different numbers of punctured bits, or different BLER target values.

DETAILED DESCRIPTION

Figure 1:
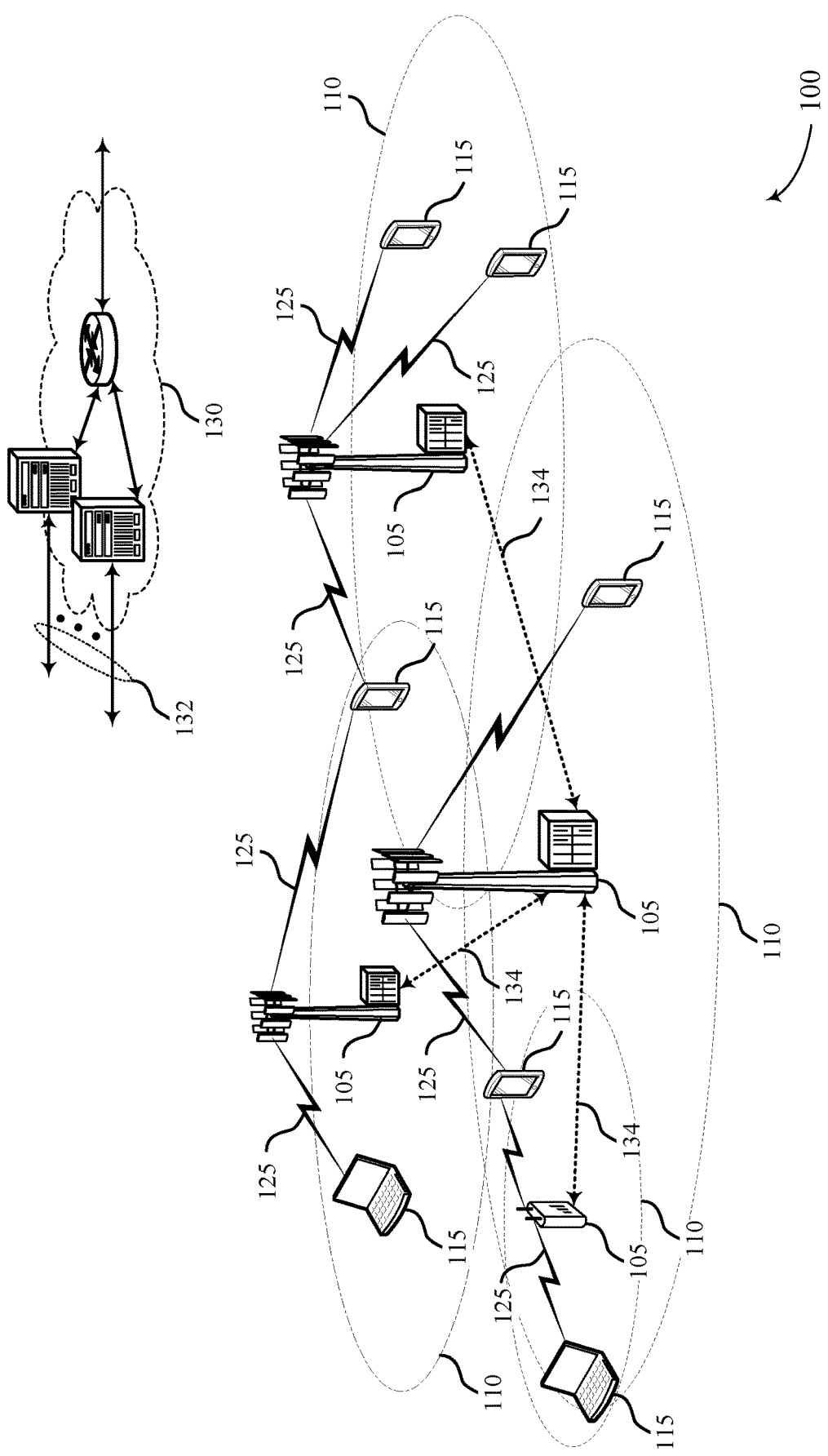
FIG. 1 illustrates an example of a system for wireless communication that supports enhanced polar code construction in accordance with aspects of the present disclosure.

In some wireless communications systems, wireless devices (e.g., base stations or user equipment (UEs)) may communicate using error-correcting codes, such as polar codes. To construct a polar-encoded codeword, the wireless device may use one or more techniques for code construction that select the most reliable bit-channels of a polar code for information bits, with less reliable bit-channels used for frozen bits. For example, bit-channel selection techniques include polarization weight (PW), generator weight (GW), density evolution (DE), or FRActally eNhanced Kernel (FRANK) code construction. Polar codes may have code lengths of $2^m$ bits, thus if a desired code block length, N, is not a power of 2 bits, the encoder may round the code block length up to the next highest power of 2 for polar encoding to generate a longer codeword. In addition, the encoder may puncture the longer codeword to generate a codeword of the desired length. In cases where the original code block is slightly greater than a power of 2, the encoder may puncture a significant number of bits. In FRANK polar code construction, for example, the encoder may recursively split the polar code into sub-blocks. Sub-blocks with a significant number of punctured bits may polarize slower than sub-blocks with fewer punctured bits. Therefore, when the sub-blocks reach a base sub-block size, base sub-blocks with more punctured bits may not be completely polarized (or as polarized as other sub-blocks). However, an encoder using FRANK polar code construction may assign information bits to a base sub-block based on the capacity of the base sub-block, without considering the rate of polarization of the base sub-block (e.g., assuming the channels in the sub-block are fully polarized). Therefore, FRANK polar code construction may assign too many information bits to sub-blocks with insufficiently polarized channels, which may result in decreased performance (e.g., higher signal-to-noise ratio (SNR) required for a given block error probability).

To improve the performance of FRANK polar code construction without significantly increasing either the complexity or memory overhead, wireless devices may implement enhanced FRANK polar code construction as described herein. For enhanced FRANK polar code construction, a wireless device may determine a number of information bits to encode, as well as a block size to transmit. The encoder may apply a capacity backoff to identify a number of sufficiently polarized channels needed to transmit the K information bits. For example, the encoder may select a capacity threshold of 0.9 and may select the backoff value (e.g., ΔK value) such that, when the capacity of the initial channel is equal to $$C_0 = \frac{K + \Delta K}{N},$$

the number of polarized channels with capacity greater than the threshold is equal to K. By recursively identifying backoff values for each sub-block, the number of information bits may propagate to the sub-blocks in proportion to the number of channels achieving the capacity threshold.

The encoder at the wireless device may identify a ΔK value, which it may use in addition to K to determine the capacity of the initial channel (i.e., $$C_0 = \frac{K + \Delta K}{N}$$

instead or just capacity $$C_0 = \frac{K}{N}).$$

The ΔK value may assist the encoder in identifying the most reliable bit-channels in the enhanced FRANK polar code construction. Therefore, the information bits may be transmitted on the most reliable bit-channels for the given K and N values. The encoder may recursively split the sub-blocks until reaching a base sub-block size. The encoder may determine a number of polarized channels in each base sub-block, and may select a number of sufficiently polarized channels in each base sub-block for the encoder to assign information bits. Computing ΔK may be computationally intensive, so the encoder may find an approximation of ΔK. For example, the encoder may determine ΔK based on a closed-form capacity backoff function using one or more of the code rate, number of information bits, block size, or block error rate (BLER).

The encoder of the wireless device may then identify a number of information bits to assign to each base sub-block. In a first example, the encoder may recursively determine ΔK values for each sub-block and sub-sub-block until reaching the base sub-blocks. The encoder may then determine a number of information bits to assign to each base sub-block based on its ΔK value. The encoder may round ΔK in each step such that there is an integer number of information bits per base sub-block. In another example, the encoder may recursively determine mutual information for each of L base sub-blocks via a mutual information transfer function. The encoder may then directly determine a number of information bits for each base sub-block based on the mutual information for the base sub-block and the capacity backoff function. In some examples, the encoder may determine the capacity backoff function using values associated with the base sub-block, the code rate, number of information bits, or BLER (e.g., a BLER target value). In this way, the encoder may calculate $K_j$ for each of j=1, . . . L base sub-blocks directly, and may avoid recursively determining the number of information bits for each sub-block iteration prior to the base sub-blocks. The encoder may then round the number of information bits determined for each base sub-block such that there is an integer value for each base sub-block, and the number of information bits in all base sub-blocks sum to K.

Aspects of the disclosure are initially described in the context of a wireless communications system. Aspects of the disclosure are further illustrated by and described with reference to apparatus diagrams, system diagrams, and flowcharts that relate to enhanced polar code construction.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an Si or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARD) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

A wireless device, such as a UE 115 or base station 105, may include an encoder and a decoder as described herein. The encoder may receive a number of information bits and a block size for the wireless device to transmit. If the block size is not a power of two, the encoder may round the block size up to the nearest power of 2 and generate a larger codeword. Excess bits of the longer codeword may be punctured to generate a codeword of the same length as the block size. The punctured bits may affect a rate of polarization when generating a polar code. For example, sub-blocks with a high number of punctured bits may polarize slower than sub-blocks with few punctured bits. Therefore, sub-blocks with many punctured bits may produce fewer fully, or even sufficiently, polarized channels. To compensate for the insufficiently polarized channels, the encoder may implement a capacity backoff when or a capacity backoff function when generating the polar code, which may assist the encoder in identifying a greater number of sufficiently polarized channels.

Figure 2:
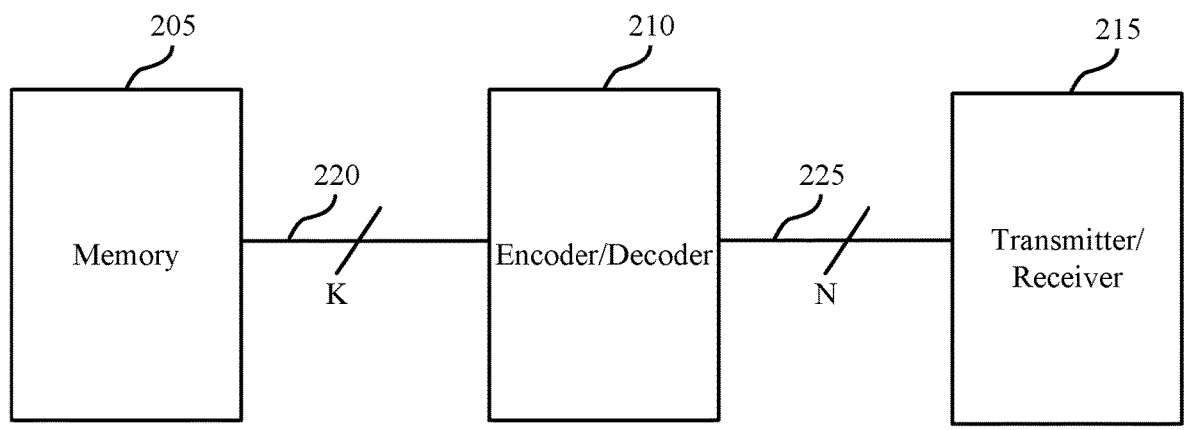
FIG. 2 illustrates an example of a device that supports enhanced polar code construction in accordance with aspects of the present disclosure.

FIG. 2 illustrates an example of a device 200 that supports enhanced polar code construction in accordance with various aspects of the present disclosure. In some examples, device 200 may implement aspects of wireless communication system 100. The device 200 may be any device within a wireless communications system 100 that performs an encoding or decoding process (e.g., using an error-correcting code, such as a polar code). Device 200 may be an example of a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some cases, device 200 may have data stored in memory 205 to transmit to another device, such as a UE 115 or base station 105. To initiate the transmission process, device 200 may retrieve the data for transmission from memory 205. The data may include a number of payload bits, 'A,' which may be 1s or 0s, provided from memory 205 to encoder/decoder 210 via first bus 220. In some cases, these payload bits may be combined with a number of parity or error checking bits, 'E,' to form a total set of information bits, 'A+E.' The number of information bits may be represented as a value 'K,' as shown. The encoder/decoder 210 may implement a polar code with a block length, 'N,' for encoding the information bits, where N may be different than or the same as K. Such a polar code may be referred to as an (N, K) polar code. In some cases, the bits that are not allocated as information bits (e.g., N−K bits) may be assigned as frozen bits.

In some cases, to perform a polar coding operation, the encoder 210 may generate a codeword of length, 'M,' where M is a power of 2 (i.e., $M=2^m$ where m is an integer value). If N is not a power of 2, the encoder 210 may round the value of N up to the nearest valid M value. For example, if N=400, the encoder 210 may determine a codeword length of M=512 (e.g., the nearest valid value for M greater than or equal to N) in order to support polar coding. In these cases, the encoder 210 may encode a codeword of length M, and then may puncture a number of bits M−N to obtain a codeword of the specified block length N for transmission.

The encoder 210 may attempt to assign the information bits to the K most reliable bit channels, and may assign the frozen bits to the remaining bit channels. In some cases (e.g., for large values of M or N, such as M=1024), the encoder/decoder 210 may implement FRANK polar code construction for assigning the information bits K to the most (or an estimation of the most) reliable bit channels. FRANK polar code construction may provide better reliability for generated codewords than some other polar coding schemes (e.g., PW, GW, etc.), and may be less complex than other polar coding schemes (e.g., DE). Additionally, FRANK polar code construction may allow the encoder 210 to flexibly adapt the coding rate when generating codewords. The encoder 210 may determine information bit channels based on FRANK polar code construction, and may assign frozen bits to the remaining channels. Frozen bits may be bits of a default value (e.g., 0, 1, etc.) known to both the encoder and decoder (e.g., the encoder encoding information bits at a transmitter and the decoder decoding the codeword received at a receiver). Further, from the receiving device perspective, device 200 may receive a data signal representing the codeword via receiver 215, and may decode the signal using decoder 210 to obtain the transmitted data.

In some wireless systems, decoder 210 may be an example of a successive cancellation (SC) or a successive cancellation list (SCL) decoder. A UE 115 or base station 105 may receive a transmission including a codeword (e.g., symbol information representing the unpunctured bits of the codeword) at receiver 215, and may send the transmission to the SCL decoder (e.g., decoder 210). The SCL decoder may determine input logarithmic-likelihood ratios (LLRs) for the bit-channels of the received codeword. During decoding, the SCL decoder may determine decoded LLRs based on the input LLRs, where the decoded LLRs may correspond to each bit-channel of the polar code. In some cases, these decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest path metrics.

If an SCL decoder determines that the first number of bits are all frozen bits, the SCL decoder may determine that the correct decoding path for the first number of bits must be the default frozen bit values (e.g., if the default frozen bit value is 0, the correct decoding path for the first number of bits must be all 0's). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1). However, the SCL decoder may still determine bit metrics for the bit channels containing frozen bits, and may use these bit metrics when calculating path metrics for the decoding path candidates. For example, the SCL decoder may update the path metric for the decoding candidates after every bit, regardless of bit type (e.g., after each frozen bit, payload bit, parity bit, etc.).

For polar codes, the encoder 210 may round up the block length up to the nearest power of 2 to generate M coded bits. N coded bits may be transmitted on N unpunctured bit channels. For non-shortening based puncturing, the encoder may split the unpunctured bit channels into a first unpunctured channel group and a second unpunctured channel group, N− and N+, where N=N_+N_+. The second unpunctured channel group, N+, may have the same number of bits as the combined number of bits in the punctured bits and the first unpunctured channel group, N−. That is, if $M=2^m$, then $N_+=2^{m-1}$, and the number of punctured bits plus the number of bits transmitted in first unpunctured channel group is also equal to $2^{m-1}$ (e.g., $(M-N)+N_-=2^{m-1}$). When N is slightly above a power of two, the number of punctured bits may be very close to, though less than, the number of bits in N+. For example, if N=1088, then M=2048, $N_+$=1024, M−N=960, and $N_-$=64. Therefore, there may be a similar, though slightly less, number of punctured bits as there are bit-channels in the second unpunctured channel group.

Channel polarization may be based on block length. For example, there may be more polarization stages for a larger block length, which may increase polarization for a sub-block with the larger block length. In theory, a block length which is infinitely long will have bit channels with a polarization of either 0 or 1. Relatedly, polarization may occur slower for sub-blocks with a large amount of puncturing due to the effective truncation of the generator matrix from puncturing. Due to the large number of punctured bits in the first sub-block, the first sub-block may polarize slower than the second sub-block (e.g., without puncturing). Therefore, FRANK polar code construction may overestimate the polarization for the first sub-block, and thus number of bit channels having a high reliability, in the first sub-block.

The encoder 210 and decoder 210 may implement enhanced FRANK polar code construction, which may allocate more bits to sub-blocks with faster polarization than sub-blocks with slower polarization time. For example, the encoder 210 and decoder 220 may allocate more bits to the second sub-block (e.g., without puncturing) than the first sub-block. The encoder 210 may also take polarization speed into consideration when recursively assigning information bits to sub-blocks. The encoder 210 may implement a capacity backoff to find a number of channels in a given sub-block with a capacity greater than a pre-defined threshold. The encoder 210 may implement techniques to find an initial capacity $C_0$ such that, in total, there are approximately K bit-channels with a capacity greater than the pre-defined threshold. The encoder 210 may then determine the number of channels in each base sub-block which have a capacity greater than the pre-defined threshold and assign information bits to those channels (e.g., via a predetermined order of bit-channels within each base sub-block).

Figure 3:
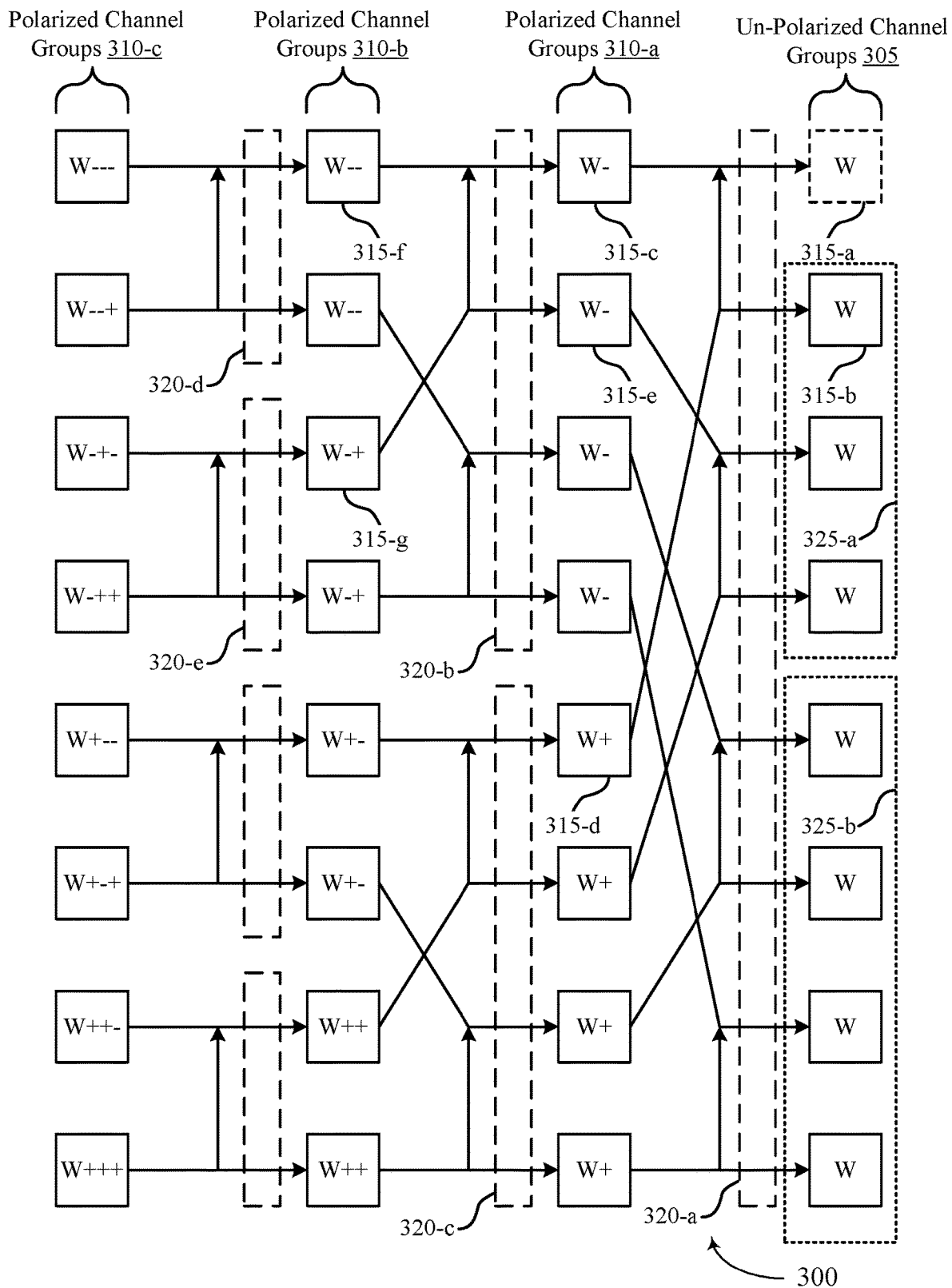
FIG. 3 illustrates an example of a fractally enhanced polar code construction that supports enhanced polar code construction in accordance with aspects of the present disclosure.

FIG. 3 illustrates an example of a fractally enhanced polar code construction 300 that supports enhanced polar code construction in accordance with various aspects of the present disclosure. In some examples, fractally enhanced polar code construction 300 may implement aspects of wireless communication system 100. An encoder/decoder 210 which may be a component of a base station 105 or UE 115 as described herein with reference to FIGS. 1 and 2 may perform the FRANK polar code construction 300. The FRANK polar code construction 300 may show a visual representation of polarization and information bit channel assignments for a polar-encoded codeword. An encoder may identify an un-polarized channel group 305 of a polar code, and may perform a series of recursive polarizations to obtain polarized channel group 310-c.

To determine the distribution of information bits between bit channels or channel groups, an encoder may utilize mutual information. Mutual information may be an example of a metric for polarization, and may map rate distributions R for un-polarized channels 315 W to rate distributions R1 and R2 for polarized channels 315 W+ and W−, respectively. In some cases, an encoder may utilize mutual information (e.g., as opposed to reliability metrics) to assign bit channels based on coding rate, R. To construct a capacity achieving polar code with SC decoding for a channel 315 W with a coding rate $$R = \frac{K}{N},$$

the encoder may distribute the information bits K such that the sub-code also achieve capacity on the polarized channels 315 W− and W+. To achieve capacity on channels 315 W− and W+, the encoder may distribute information bits according to:

$$K_{lower} = R1 * \left(\frac{N}{2}\right), \text{ and } K_{upper} = \frac{R0}{R0 + R1} * K,$$

where $K_{upper}$ is the number of information bits to include in the first half of sub-blocks, $K_{lower}$ is the number of information bits to include in the second half of sub-blocks and $K = K_{lower} + K_{upper}$, R0 is the capacity of a channel W−, and R1 is the capacity of a channel W+. In some cases, $K_{upper}$ may be referred to as K− and $K_{lower}$ may be referred to as K+.

For FRANK polar code construction 300 with greater than two channels, the encoder may recursively perform these polarizations and information bit assignment procedures. For example, as illustrated, the encoder may polarize un-polarized channels 315-a and 315-b, resulting in polarized channels 315-c and 315-d. In this case, based on the channel polarization, channel 315-d may have a greater channel capacity than channel 315-c. Accordingly, channel 315-d may be referred to as channel W+ (e.g., greater channel capacity than an un-polarized channel 315 W), and channel 315-c may be referred to as W− (e.g., lesser channel capacity than the un-polarized channel 315 W). Similarly, the encoder may polarize the other un-polarized channels 315 in the un-polarized channel group 305, resulting in polarized channel group 310-a. As each polarization process receives two channels 315 (e.g., with equal channel capacity) as input and outputs two polarized channels (e.g., one channel with higher channel capacity than the inputs, and one channel with lower channel capacity), each stage of the recursive process may turn a group of channels into two equally sized sub-blocks 320 of polarized channels.

As illustrated, an encoder may polarize a set of eight input channels 315. These eight input channels 315 may correspond to the codeword size M. The encoder may encode a number of information bits K (e.g., four information bits) within this codeword. Accordingly, before the first recursive step, the encoder may include one block 320-a corresponding to M total bits and K information bits. Upon performing the first recursive step, the encoder may generate polarized channel group 310-a, where a first half of the channels 315 have a lower capacity and a second half of the channels 315 have a higher capacity. The first half of the channels 315 may correspond to a first sub-block 320-b, and the second half may correspond to sub-block 320-c. In the case describe herein where M=8, each of these sub-blocks 320 may include four bits total.

The encoder may use the mutual information metrics to determine how many information bits to include in each sub-block 320. For example, the encoder may include a channel polarization mutual information transfer chart—or a table with functions or values representing the channel polarization mutual information transfer chart—in memory. The encoder may determine target mutual information for the input channel 315 W based on the target coding rate R. For example, as described herein, a codeword of length M=8 containing a number of information bits K=4 may result in a target code rate of $$R = \frac{K}{M} = \frac{1}{2}.$$

Based on the target mutual information for the input channel 315 W and the channel polarization mutual information transfer chart, the encoder may determine the target mutual information for the output channels 315 W− and W+, where the target mutual information values may be referred to as Cap(W−) and Cap(W+), respectively. The encoder may then determine the information bits K0 to include in the first sub-block 320-b and the information bits K1 to include in the second sub-block 320-c according to the equations:

$$K0+K1=K \text{ and } K0/K1=\text{Cap}(W-)/\text{Cap}(W+),$$

such that the encoder allocates a number of information bits K0 to channels W− and a number of information bits K1 to channels W+ proportional to the capacity or mutual information of the channels W− and W+. For example, in the case described above, the mutual information values Cap(W−) and Cap(W+) may be approximately 0.25 and 0.75 for an initial capacity of 0.5, and encoder may allocate one information bit (i.e., K0=1) to the first sub-block 320-b and three information bits (i.e., K1=3) to the second sub-block 320-c. In some cases, the encoder may perform rounding to assign an integer number of information bits to each sub-block 320.

In a next step, the encoder may recursively perform the polarization process on each sub-block 320. For example, the encoder may polarize the channels 315 in sub-block 320-b to generate sub-blocks 320-d and 320-e. In this case, the input channels 315-c and 315-e may have channel capacities of W− (e.g., based on the polarization in the first step of the recursive process), and the corresponding output channels 315-*f* and 315-*g* may have resulting channel capacities of W−− (e.g., a lower channel capacity than W−) and W−+ (e.g., a greater channel capacity than W−). In this way, polarized channel group 310-*b* may include channels 315 with greater polarization diversity than polarized channel group 310-*a*. Similar to the process described above, the encoder may implement the channel polarization mutual information transfer chart to determine the information bits to assign to sub-blocks 320-*d* and 320-*e*. For example, following this next step in the recursive polarization process, sub-block 320-*d* may have size N=2 and information bits K00=0, and sub-block 320-*e* may have size M=2 and information bits K01=1.

The encoder may continue the recursive process of polarization and information bit allocation until the sub-blocks 320 for a polarized channel group 310 are less than or equal to a pre-determined threshold sub-block size (e.g., 32, 64, 128, etc.). Information bits may be allocated to bit-channels with a pre-calculated bit channel reliability sequence within each sub-block 320 of the threshold sub-block size. For example, the encoder may store a known bit sequence in memory (e.g., based on or derived by a PW, GW, Gaussian approximation (GA), DE, mutual information DE, nested DE, or some similar technique) for one or more codeword sizes. In some cases, the encoder may store a bit sequence for a codeword of length 64 bits. In such cases, the encoder may terminate the recursive FRANK polar code construction 300 when the sub-blocks 320 for a polarized channel group 310 have a codeword length of 64 bits, and may allocate information bits within these 64 bit sub-blocks 320 based on the bit sequence stored in memory. In some cases, the encoder may store additional bit sequences for code blocks of sizes less than the threshold size (e.g., in case the input codeword contains fewer total bits than the threshold sub-block size, the encoder may allocate information bits without performing any recursive steps).

The above process may result in reliable bit-channel selection for input channels 315 assuming equal codeword channel capacities (e.g., all of the bit-channels start with capacities W). However, in some cases, an encoder may perform bit puncturing. For example, the encoder may want to use a block length N for encoding. However, for the polar coding procedure, the encoder may need a number of channels M, where $M=2^m$ for integer values of m. In such cases, the encoder may puncture a number of bits M−N in order to use the specified block length. For example, the encoder may use a block length N=7 for polar encoding. To perform the polar encoding procedure, the encoder may round the block length up to the nearest power of 2 (e.g., to satisfy the criteria for polar encoding where $M=2^m$ for integer values of m). In this case, the encoder may determine M=8 for N=7, with one bit to puncture. The encoder may perform unknown-bit puncturing (e.g., block puncturing) or known-bit puncturing (e.g., shortening). In the case of unknown-bit puncturing, the encoder may puncture the first bit of the codeword, corresponding to channel 315-*a*. In this case, the encoder may process the channel 315-*a* and any other channels 315 corresponding to punctured bits as if the channels have a capacity and mutual information of 0 (e.g., treat the corresponding encoder input bit-channel as a frozen bit).

The N coded bits from unpunctured bit-channels 325-*a* and unpunctured bit-channels 325-*b* may be transmitted, and may be represented by $N_-$ and $N_+$ respectively, where $N=N_-+N_+$. In this example, the first coded group of unpunctured channels 325-*a* has three coded bits on three unpunctured bit-channels, and the second coded group of unpunctured channels 325-*b* has four coded bits on four unpunctured bit-channels. The second group of unpunctured channels 325-*b* may have a number of unpunctured bit-channels equal to the combination of the number of punctured bits (e.g., one, corresponding to channel 315-*a*) and number of unpunctured channels in the first group of unpunctured channels 325-*a*. That is, if $M=2^m$, then $N_+=2^{m-1}$, and the number of punctured bits plus the first group of unpunctured channels 325-*a* is also equal to $2^{m-1}$ (e.g., $(M-N)+N_-=2^{m-1}$). When N is slightly above a power of two, the number of punctured bits may be large. For example, if N=1088, then M=2048, $N_+$=1024, M−N=960, and $N_-$=64. Thus, when dividing the code block into sub-blocks, there may be a large number of punctured bits in one of the sub-blocks.

A rate of polarization may be based on the block length of a sub-block 320, or the number of unpunctured bits in the sub-block 320. In theory, a block length which is infinitely long will have a capacity of either 0 or 1 with all channels fully polarized. However, for a finite block length, the capacities of the polarized bit channels lie between 0 and 1. A larger capacity may indicate a better bit channel quality. Relatedly, polarization may occur slower for sub-blocks 320 with more punctured bits due to effective truncation of the generator matrix. The large number of punctured bits in the first sub-block 320 may slow down its rate of polarization. However, conventional FRANK polar code construction techniques may assign information bits to the first sub-block based on capacity, ignoring the rate of polarization. Therefore, some polar coding schemes may over-allocate information bits to the first sub-block with many punctured bits.

The encoder may implement enhanced FRANK polar code construction, which may allocate more bits to sub-blocks 320 with faster polarization. Thus, the encoder may also take polarization speed into consideration when recursively assigning information bits to sub-blocks 320. The encoder may implement techniques to find a total number of partially polarized channels, corresponding to a capacity $C_0$, such that there are approximately K channels with a capacity greater than a pre-defined threshold. The encoder may then allocate the information bits to base sub-blocks in proportion to the number of channels with capacity greater than the threshold. Within base sub-blocks, information bits may be assigned to the bit-channels having the highest reliability (e.g., according to PW, GW, DE, etc.).

Figure 4:
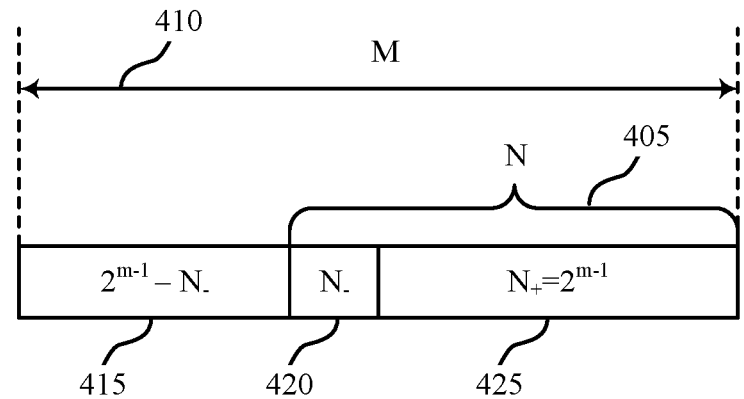
FIG. 4 illustrates an example of a block size and polarization relationship that supports enhanced polar code construction in accordance with aspects of the present disclosure.
Figure 4:
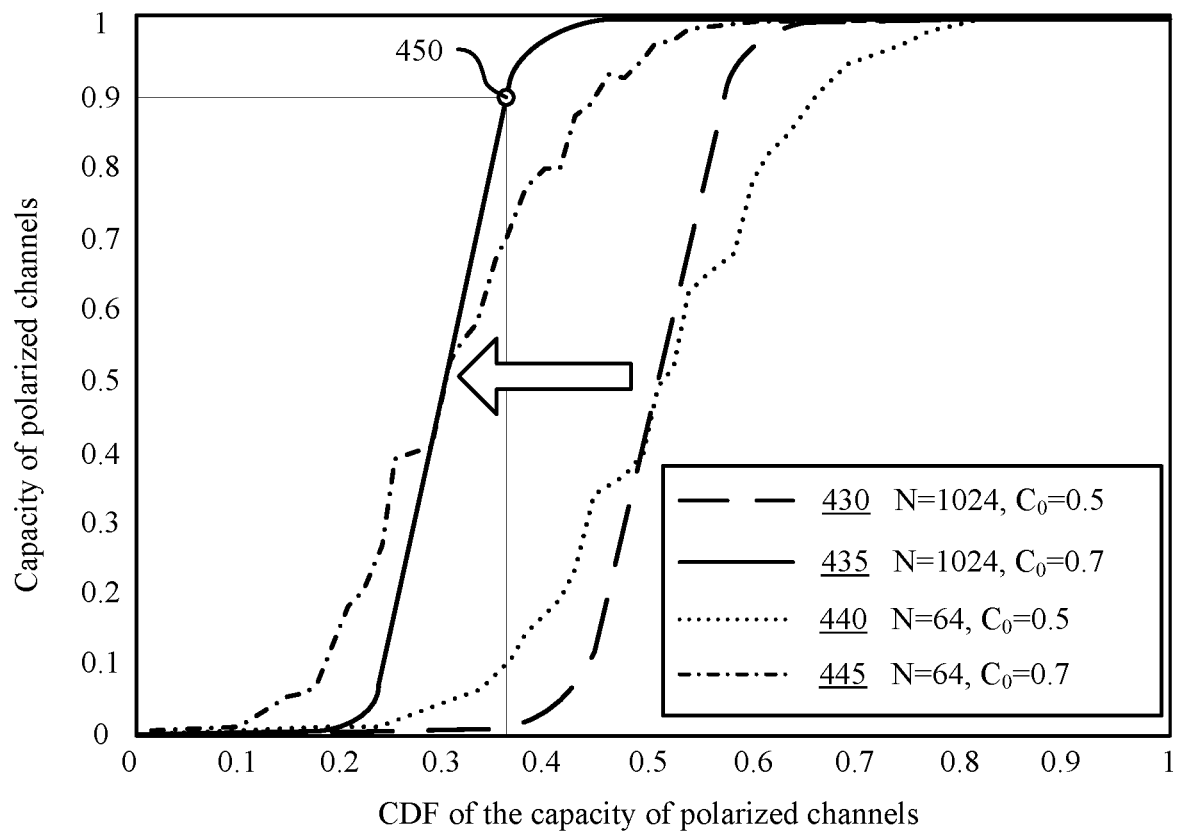

FIG. 4 illustrates an example of a block size and polarization relationship 400 that supports enhanced polar code construction in accordance with various aspects of the present disclosure. In some examples, block size and polarization relationship 400 may implement aspects of wireless communication system 100.

The block size and polarization relationship 400 shows how block size and mutual information, or capacity, affect a rate of polarization. The encoder may use a block length 405 of N bits to transmit a number of information bits, K. If the block length 405 is not a power of 2, the encoder may round the value of the block length 405 up to the nearest valid value for a valid codeword length 410, shown by M, with the valid codeword length being $2^m$ bits long. The encoder may encode a codeword of length M and puncture a number of bits M−N to obtain a codeword of the block length 405.

To encode the codeword of the valid codeword length 410, the codeword may be separated into to two equal-length sub-blocks. A first sub-block may include a number of punctured bits 415 as well as a first number of coded bits 420, corresponding to $N_-$. The first number of coded bits 420 may be unpunctured bits. A second sub-block may include a second number of coded bits 425, corresponding to $N_+$, which may also be unpunctured bits of the codeword. If the block length 405 is not a power of 2, the largest power of 2 bits in the block length (e.g., the second number of coded bits 425, or $N_+$) may be in the second sub-block, and the remaining bits (e.g., the first number of bits 420, or $N_-$) may be in the first sub-block with the number of punctured bits 415.

The encoder may recursively divide the codeword 410 when performing FRANK polar code construction. The encoder may perform polarization and information bit assignment procedures as described with reference to FIG. 3. However, there may be a large amount of punctured bits in a first sub-block. Therefore, the first sub-block may polarize slower than the second sub-block.

The block size and polarization relationship 400 shows a graph illustrating the different polarization speeds, specifically the capacity of polarized channels vs a cumulative distribution function (CDF) of the capacity of the polarized channels. The graph illustrates polarization speeds for four different code block length and capacity configurations. A first configuration 430 has a code block length of 1024 and an unpolarized channel capacity (e.g., $C_0$ as described in FIGS. 2 and 3) of 0.5. A second configuration 435 has a code block length of 1024 and an unpolarized channel capacity of 0.7. Using smaller code block lengths, a third configuration 440 has a code block length of 64 and an unpolarized channel capacity of 0.5, and a fourth configuration 445 has a code block length of 64 and an unpolarized channel capacity of 0.7.

The first configuration 430 and the second configuration 435 may have similar polarization speeds, but increasing the unpolarized channel capacity increases the percentage of channels having high capacity. At a capacity threshold 450 (e.g., capacity=0.9), the first configuration 430 has approximately 55% of its channels under a capacity of 0.9 and 45% of its channels over a capacity of 0.9. If the encoder determines that a capacity of 0.9 is reliable for assigning information bits, the first configuration 430 has 0.45*1024=460 or 461 reliable channels for bit assignment. In comparison, the second configuration 435 has approximately 35% of its channels under a capacity of 0.9 and 65% of its channels over a capacity of 0.9. This corresponds to 0.65*1024=665 or 666 reliable channels for information bit assignment.

The third configuration 440 and the fourth configuration 445 may also have similar polarization speeds. However, these polarization speeds may be slower than the first configuration 430 and the second configuration 435, which may respectively have a same unpolarized channel capacity, but larger block size. The third configuration 440 may have approximately 35% reliable channels, resulting in 22 or 23 reliable channels, and the fourth configuration 445 may have approximately 45% reliable channels, resulting in 0.55*64=35 or 36 good channels.

In other implementations, the encoder may determine a channel is reliable for assigning information bits based on other metrics, such as a different capacity threshold, or also considering the percentage of channels which are close to 0 capacity (e.g., with a capacity of 0.1 or less, or some other low capacity).

In some cases, the first configuration 430 and the third configuration 440 may correspond to the second number of coded bits 425 and the first number of coded bits 420 respectively. For example, the second number of coded bits 425 may include 1024 bits, the first number of coded bits 420 may include 64 bits, and the codeword with block length 405 of N=1088 bits may have an unpolarized channel capacity of $C_0$=0.5. In this example, the encoder may be given 544 information bits for a block length of N=1088 to have a coding rate of ½. In this example, the encoder may round 1088 up to 2048 and generate a codeword of 2048 bits. The encoder may puncture 960 bits of the codeword to generate a codeword of 1088 bits. The encoder may initiate polar coding and split the codeword into two sub-groups at the first stage of polar coding. A first sub-group may have 64 unpunctured bits and 960 punctured bits, while a second sub-groups has 1024 unpunctured bits. A generator matrix for the first sub-block is effectively truncated by the 960 punctured bits to a code block of 64 bits, channels for the punctured bits may be treated as having a capacity of 0. Therefore, the first sub-block may polarize slower and may provide fewer reliable bit-channels than a conventional fractally enhanced kernel polar coding method would assume. In this example, the CDF for the first sub-group is shown as the third configuration 440, and the CDF of the second sub-group is shown as first configuration 430.

To select the most reliable channels (e.g., as estimated or approximated), the encoder may determine a number of information bits to allocate to each base sub-block by considering the different polarization speed in each sub-block. For example, the encoder may determine a number of channels in a given sub-block with capacity greater than a pre-defined threshold, t. In some cases, the threshold t may be related to the BLER target of the code. In examples where a BLER target value may be set for 0.01, t may be set for a corresponding value (e.g., t=0.9) based on a correspondence (e.g., one-to-one correspondence) between BLER and channel capacity (e.g., a BLER to capacity mapping function). In such examples, each polarized bit channel with a capacity greater than t=0.9 may be associated with a reliability corresponding to the BLER target value of 0.01. In examples described herein, t=0.9, but t may be a semi-statically or dynamically configurable value, or t may be predetermined by or preconfigured in the encoder.

In another example, the BLER target may be $10^{-5}$. In such examples, a larger threshold t (e.g., t=0.99) may be implemented to construct the polar code (e.g., each polarized bit channel with a capacity greater than t=0.99 may be associated with a reliability corresponding to a BLER target value of $10^{-5}$). The values given herein are used for exemplary purposes only, as such, other BLER values and t values may be used in further examples, and the correspondence between BLER and t may be different.

The encoder may apply a capacity backoff function when allocating information bits to sub-blocks. The encoder may determine a number of bits, ΔK, such that there are a total number of channels with a capacity greater than t equal to K (e.g., the number of information bits). The initial capacity for the mutual information transfer function may be based on a sum of a rate of the polar code and the capacity backoff function evaluated for the rate of the polar code and a number of the unpunctured bit-channels of the codeword. For example, the encoder may determine ΔK such that a channel capacity for any given unpolarized channel is $$C_0 = \frac{K + \Delta K}{N}.$$

In some cases, me encoder may gradually increment ΔK until the number of sufficiently reliable channels (e.g., channels having a reliability over the threshold) equals the K information bits. As shown in the above graph, increasing the unpolarized channel capacity may increase the number of reliable channels. Based on the mutual information transfer function and the capacity backoff function, the encoder may identify the most reliable channels when allocating information bits.

In some examples, the encoder may iteratively determine the number of polarized channels with a capacity greater than t for each base sub-block as in fractal enhanced kernel polar code construction. For example, the encoder may have K information bits in a code block of size N. The encoder splits the code block into two sub-blocks and determines a number of information bits for the first sub-block, $K_-$, and a number of information bits for the second sub-block, $K_+$. The encoder may recursively split the sub-blocks (e.g., $K_-$ into $K_{--}$ and $K_{-+}$) until reaching a base sub-block size with $M_{min}$ total bit-channels (e.g., 32, 64, 128, etc.). The encoder may then set the number of reliable channels with a capacity greater than t for each base sub-block, where the total number of reliable channels is equal to or greater than K.

Figure 5:
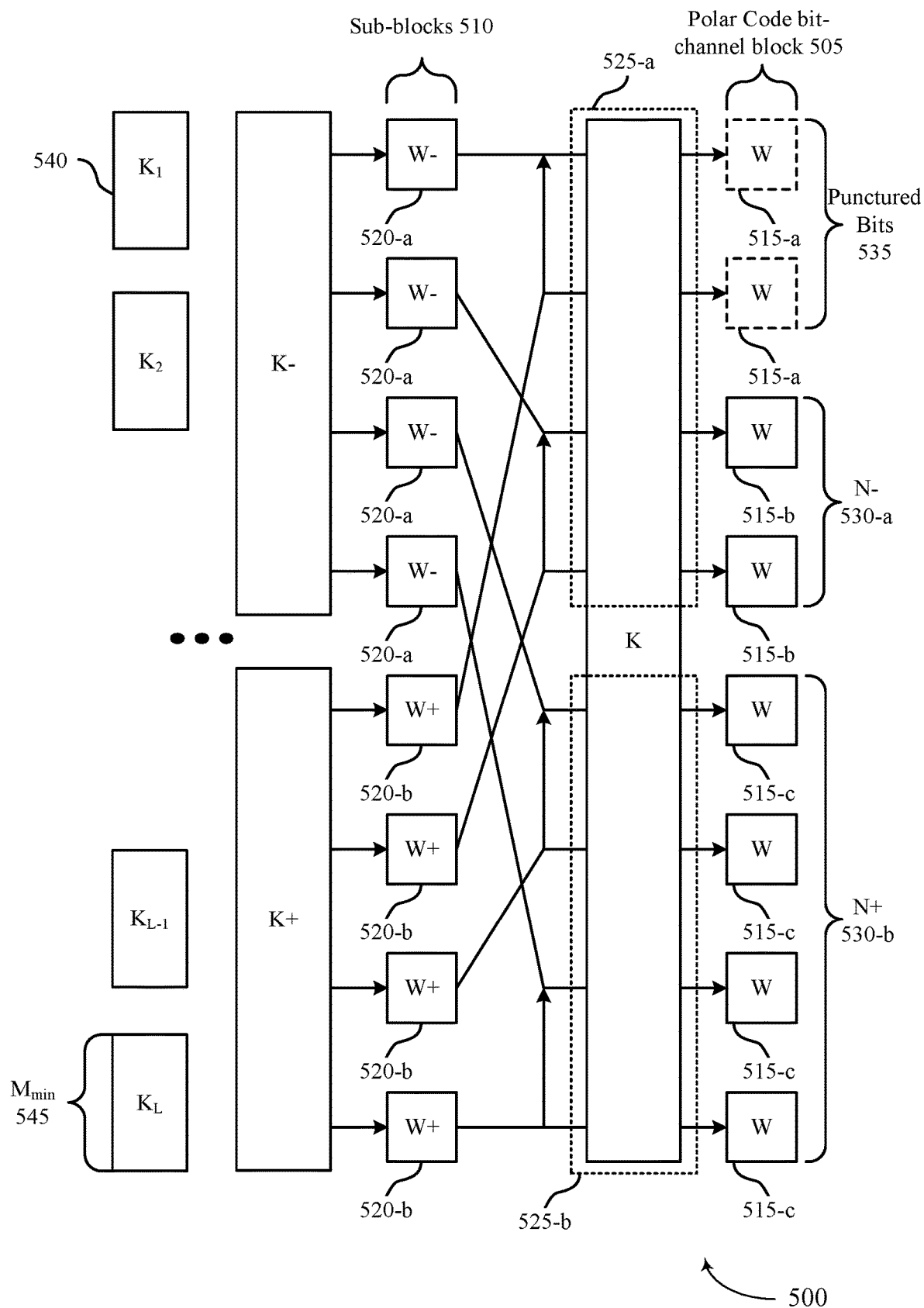
FIG. 5 illustrates an example of an enhanced polar coding that supports enhanced polar code construction in accordance with aspects of the present disclosure.

FIG. 5 illustrates an example of an enhanced polar coding 500 that supports enhanced polar code construction in accordance with various aspects of the present disclosure. In some examples, enhanced polar coding 500 may implement aspects of wireless communication system 100. The enhanced polar coding 500 may be implemented by an encoder of a wireless device, such as a UE 115 or a base station 105, as described herein.

The enhanced FRANK polar coding 500 shows a visual representation of polarization and information bit channel assignments for an example polar-encoded codeword. An encoder may start with un-polarized channel block 505 and perform a series of recursive polarizations to obtain a polarized sub-block 510. An encoder may generate a polar code for K information bits and a block length of N bits as described in FIGS. 2 and 3. The encoder may generate a codeword of length M bits, where the integer $M=2^m$ and M>N, and may puncture M−N bits to generate a codeword of length N. The encoder may puncture the first M−N bits of the codeword, corresponding to the unpolarized channels 515-a and the punctured bits 535. In some cases, the encoder may process the channels 515-a as if the channel has a capacity and mutual information of 0.

The polarized channel sub-blocks 510 may include two polarized channel sub-blocks, half of which are polarized toward a capacity of zero (e.g., W−) and half of which are polarized toward a capacity of one (e.g., W+). That is, a polarized channel 520-a, W−, may be less reliable for information transmission than a polarized channel 520-b, W+. The encoder may distribute K information bits into two sub-blocks corresponding to the reliability of the channel sub-blocks. For example, the encoder may assign more of the K information bits to polarized channels 520-b than polarized channels 520-a. The encoder may recursively polarize channel groups and assign information bits until the size of the sub-blocks reach a pre-determined threshold sub-block size, or a base sub-block size, which may correspond to a pre-calculated bit channel reliability sequence as described in FIG. 3.

An encoder or a decoder may apply techniques for enhanced FRANK polar coding. A first sub-block 525-a may include punctured bits 535 corresponding to punctured channels 515-a and a first number of coded bits 530-a (e.g., $N_-$) transmitted on unpunctured channels 515-b respectively. A second sub-block 525-b may include a second number of coded bits 530-b (e.g., $N_+$) transmitted on unpunctured channels 515-c. Due to the number of punctured bits 535 in the first sub-block 525-a, the first sub-block 525-a and the second sub-block 525-b may polarize at different rates. The first sub-block 525-a may polarize slower than the second sub-block 525-b based on having a smaller effective block size, where the block size of the first sub-block 525-a may be reduced due to the puncturing.

As described in FIG. 4, the encoder may over-allocate information bits to the first sub-block when applying conventional FRANK polar coding. Conventional FRANK polar coding schemes may assume fully polarizable channels, however, sub-blocks with different amounts of unpunctured bits may polarize at different rates. Thus, sub-blocks with more unpunctured bits may produce a greater number of reliable channels while sub-blocks with fewer unpunctured bits may produce relatively fewer reliable channels. Therefore, the encoder and the decoder apply techniques to identify the most reliable bit-channels for the information bits by also considering the rate of polarization of a sub-block. Also as shown in FIG. 4, applying a capacity backoff function in allocation of information bits may select more reliable bit-channels for the K information bits in the presence of a high degree of puncturing.

The encoder may determine a number of bits, ΔK, such that the total number of channels with a capacity greater than t is equal to K (e.g., the number of information bits). For example, the encoder may determine ΔK such that a channel capacity for an unpunctured, unpolarized channel (e.g., W 515-b or W 515-c) is $$C_0 = \frac{K + \Delta K}{N}.$$

In some cases, the encoder may gradually increment ΔK until K bit-channels have been identified having reliability greater than the threshold t. As shown in FIG. 4, increasing the unpolarized channel capacity may increase the apparent number of reliable channels, in proportion to polarization speed.

The number of polarized channels with a capacity greater than t for each base sub-block 540 may be determined iteratively as in fractal enhanced kernel polar code construction. For example, the encoder may have K information bits in a code block of size N. The encoder splits the code block into two sub-blocks and determines a number of information bits for the first sub-block, $K_-$, and a number of information bits for the second sub-block, K. The encoder may recursively split the sub-blocks (e.g., $K_-$ into $K_{--}$ and $K_{-+}$) until reaching a base sub-block size 545 (e.g., $M_{min}$). The encoder may determine the number of reliable channels with a capacity greater than t for each base sub block, where the total number of reliable channels is equal to or greater than K. In some cases, the number of reliable channels in a base sub-block 540 may be based on capacity of the base sub-block 540 and a capacity backoff function.

For example, if the polar code generates L base sub-blocks 540, the encoder may set $K_j$, the number of information bits assigned to base sub-block j, to be the number of polarized channels in sub-block j with a capacity greater than t for j=1, . . . , L (i.e. for each base sub-block 540).

In some cases, the encoder may iteratively step up ΔK until there are exactly sufficient reliable channels for the K information bits. However, this process may be computationally intensive. Therefore, in other situations, the encoder may determine an approximation of ΔK according to some closed form function.

For example, the encoder may use ΔK=ƒ(N,R,∈) as an approximation for ΔK, where $$R = \frac{K}{N},$$

or the rate, and ƒ is a closed form function. As an exemplary function, $f(N,R, Å)=c_1 N^{c_2} (R(1-R))^{c_3} \times g(\in)$, where $c_1$, $c_2$, and $c_3$ are fixed constants, and ∈ is a target block error rate (BLER) value for the number of polarized channels. Example constant values may be $c_1=1$, $c_2=0.7527$, $c_3=0.6852$. An example of g(∈) may be an inverse of the function Q such that $g(\in)=Q^{-1}$, where Q may be given as the error function $$Q(x) = \int_x^\infty \frac{1}{\sqrt{2\pi}} e^{-\frac{t^2}{2}} dt.$$

In other examples, ƒ and g may be different functions, or the constant values may be different values. In some examples, the BLER target value E and corresponding g(∈) may impact polar code construction (e.g., different identified bit channels or allocation of information bits). For example, different applications or services may have different reliability requirements, and different polar code constructions as a result of differing BLER target values may be provided to meet the requirements of the different applications or services. The use of a capacity backoff function (e.g., according to the closed form function ƒ(N,R,∈)) provides an efficient way to construct different polar codes to meet the different requirements. In further examples, g(∈) may be equal to one (1) (e.g., ƒ may not depend on the threshold BLER). In some examples, the function ƒ(N,R,∈) may characterize or approximate the rate of polarization of capacity (or mutual information) as shown in FIG. 4. For example, the value ƒ(N,R,∈) R may correspond to the percentile of channels with a capacity greater than a threshold t (which may have a one-to-one correspondence to the BLER target E), under the configuration of block length N and capacity K.

Upon determining ΔK or an approximation of ΔK, the encoder may compute $K_j$, or the number of information bits applied to base sub-block j, for each base sub-block 540. The encoder may apply ΔK when determining $K_-$ and K.

If $K=K_-+K_+$, then it may be given that $\Delta K=\Delta K_- + \Delta K_+$. The encoder may determine a ratio of $K_-$ and $K_+$ according to a ratio between modified capacities of the bit-channel sub-blocks. In some cases, a modified capacity may be equal to the respective capacity backoff function subtracted from the channel capacity. That is, the modified capacities may be given by $NI_- - \Delta K_-$ and $NI_+ - \Delta K_+$, and the ratio between the modified capacities of the bit channel sub-blocks may be $$\frac{K_-}{K_+} = \frac{NI_- - \Delta K_-}{NI_+ - \Delta K_+}, \text{ where } \frac{\Delta K_-}{\Delta K_+} = \frac{f(N, I_-)}{f(N, I_+)}.$$

Alternatively, the encoder may obtain the capacity ratio by setting $K_-=NI_- - \Delta K_-$ and $K_+=NI_+ - \Delta K_+$. The terms $I_-$ and $I_+$ may be mutual information values for the negatively polarized sub-block and positively polarized sub-block, respectively. In some cases, $I_-$ and $I_+$ may be determined according to a mutual information transfer function evaluated for the initial capacity $$C_0 = \frac{K + \Delta K}{N}.$$

Based on the given expressions, the encoder may compute $\Delta K_-$ and $\Delta K_+$. The encoder may recursively perform steps described above to determine a ΔK value for smaller sub-blocks (e.g., $\Delta K_{-+}$, $\Delta K_{--}$, and $\Delta K_{++}$ for the next iteration) until reaching the base sub-block size 545. As described, the encoder determines a ΔK value for each base sub-block 540, which the encoder uses to determine a number of information bits to assign to each base sub-block. The encoder may round the values determined in each step of recursion to get an integer $K_1$ value.

In another example, the encoder may determine mutual information $I_j$, where j=1, ... L, for each base sub-block 540 recursively via a mutual information transfer function. The encoder may then determine an approximate value of $K_1$, shown as $\tilde{K}_j = N_j I_j - \Delta K_j$, where $\Delta K_j$ is determined as shown in Equation 1. By construction, $\widetilde{K_1} + \ldots + \widetilde{K_L} = K$.

$$\Delta K_j = \frac{f(N_j, I_j)\Delta K}{f(N_1, I_1) + \ldots + f(N_L, I_L)}, j = 1, \ldots, L \quad (1)$$

The encoder may round $\tilde{K}_j$ to obtain integer-valued $K_j$. In a first example, the encoder may use pattern-based rounding. The encoder may determine a sequence $(a_1, \ldots, a_L)$, which may in some cases be a permutation of $\{1, \ldots, L\}$. For example, if L=8, the sequence may be (8, 7, 6, 5, 4, 3, 2, 1), where $a_1=8$ and $a_L=1$. The encoder may then set a first rounding error value $\in_0=0$. The encoder may set $K_{a_1}$=round $(\tilde{K}_{a_1})$, and let $\in_1 = K_{a_1} - (\tilde{K}_{a_1} + \in_0)$ be the rounding error. In a second step, the encoder may set $K_{a_2}$=round$(\tilde{K}_{a_2} + \in_1)$, and let $\in_2 = K_{a_2} - (\tilde{K}_{a_2} + \in_1)$ be the rounding error in the first rounding step. The encoder may iterate the rounding process through the base sub-blocks 540. For sub-block L, the encoder may set $K_{a_L} = \tilde{K}_{a_L} + \in_{L-1}$, which rounds $\tilde{K}_{a_L}$ to the integer $K_{a_L}$. At each step, if the $K_a$ value is less than zero, then the $K_a$ value may be set to 0.

In another example, the encoder may implement recursive rounding to round $\tilde{K}_j$ to $K_j$. The encoder may determine $K_-$ and $K_+$ based on $K_-$=round$(\tilde{K}_1 + \ldots \tilde{K}_{L/2})$ and $K_+=K-K_-$. The encoder may recursively iterate through the sub-block groups. For example, $K_{--}$=Round$(\tilde{K}_{--} + \ldots + \tilde{K}_{L/4})$ and $K_{-+}=K_- - K_{--}$, and so on. The encoder may repeat this process until determining $K_j$ for the base sub-blocks 540.

Although the description of FIGS. 3-5 discusses bit-channel selection performed by an encoder, a decoder may perform similar steps to identify the bit-channel locations used by the encoder for the information bits. The decoder may then perform SC or SCL decoding using the identified information bit locations to identify candidate paths for an information vector. Error checking (e.g., parity checking, CRC) may identify a successfully decoded candidate path. An encoder or decoder may also determine ΔK values or $K_-$ and $K_+$ according to a table referenced by K, N, and M that is calculated according to techniques described herein. Additionally or alternatively, the table may identify the set of bit locations used for information bits K, N, and M, the set determined according to the techniques described herein.

Figure 6:
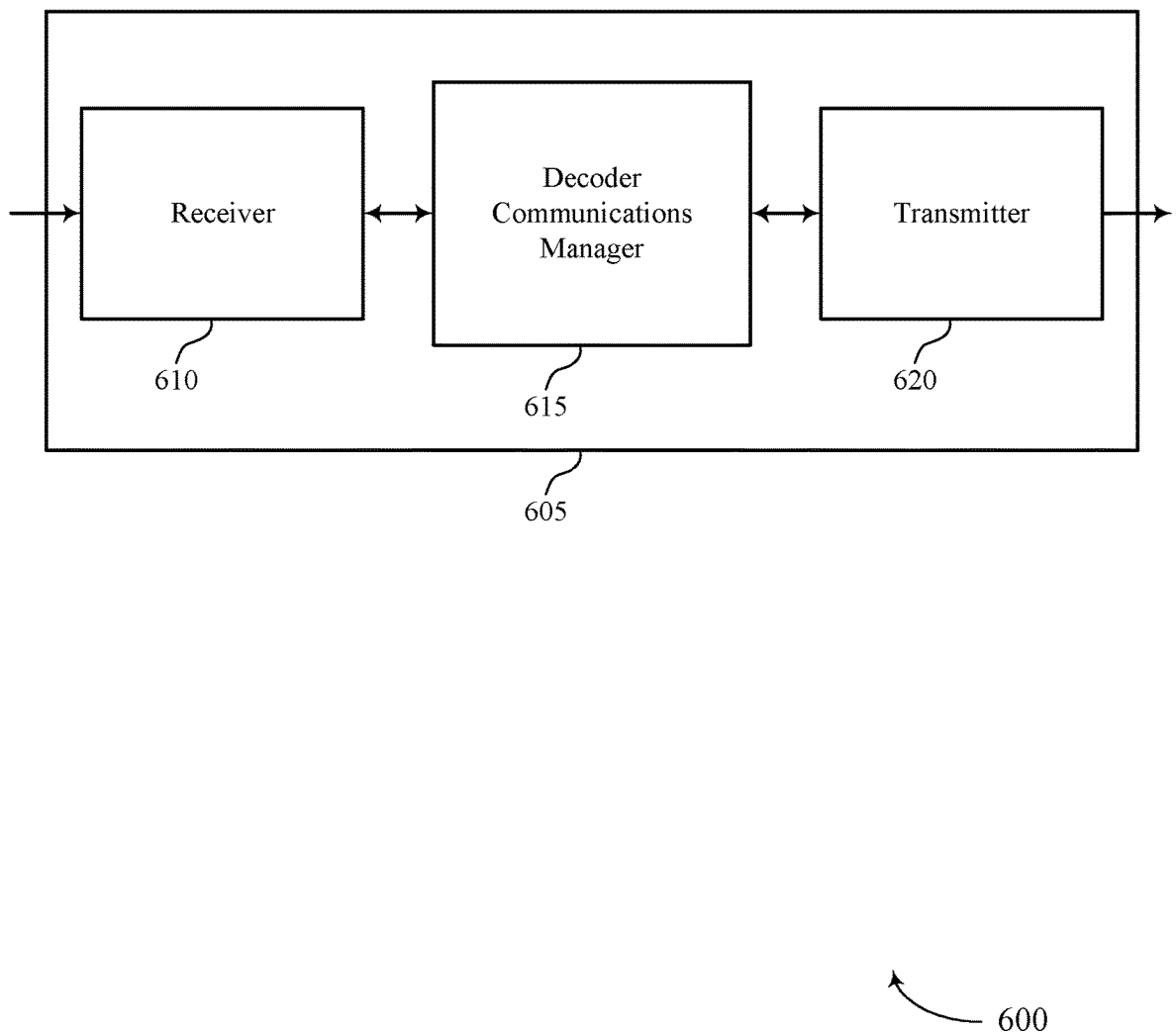
FIGS. 6 through 8 show block diagrams of a device that supports enhanced polar code construction in accordance with aspects of the present disclosure.

FIG. 6 shows a block diagram 600 of a wireless device 605 that supports enhanced polar code construction in accordance with aspects of the present disclosure. Wireless device 605 may be an example of aspects of a decoder as described herein, or wireless device 605 may include a decoder as described herein. Wireless device 605 may include receiver 610, decoder communications manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to enhanced polar code construction, etc.). Information may be passed on to other components of the device. The receiver 610 may be an example of aspects of the transceiver 935 described with reference to FIG. 9. The receiver 610 may utilize a single antenna or a set of antennas.

Decoder communications manager 615 may be an example of aspects of the decoder communications manager 915 described with reference to FIG. 9.

Decoder communications manager 615 and/or at least some of its various sub-components may be implemented in hardware, software executed by a processor, firmware, or any combination thereof. If implemented in software executed by a processor, the functions of the decoder communications manager 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The decoder communications manager 615 and/or at least some of its various sub-components may be physically located at various positions, including being distributed such that portions of functions are implemented at different physical locations by one or more physical devices. In some examples, decoder communications manager 615 and/or at least some of its various sub-components may be a separate and distinct component in accordance with various aspects of the present disclosure. In other examples, decoder communications manager 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Decoder communications manager 615 may receive a signal representing a codeword over a wireless channel, the codeword being encoded using a polar code of a given code length, identify, in the signal, unpunctured bit-channels of the codeword, identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, and decode the signal according to the polar code to obtain an information bit vector at the set of bit locations. In some examples, decoder communications manager 615 may include a data structure (e.g., one or more tables) that identifies the set of bit locations. The data structure may include different tables of sets of bit locations for different combinations of polar code length, code rate, puncturing, or BLER. In some examples, the data structure may be in a memory of a device (e.g., memory 925).

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
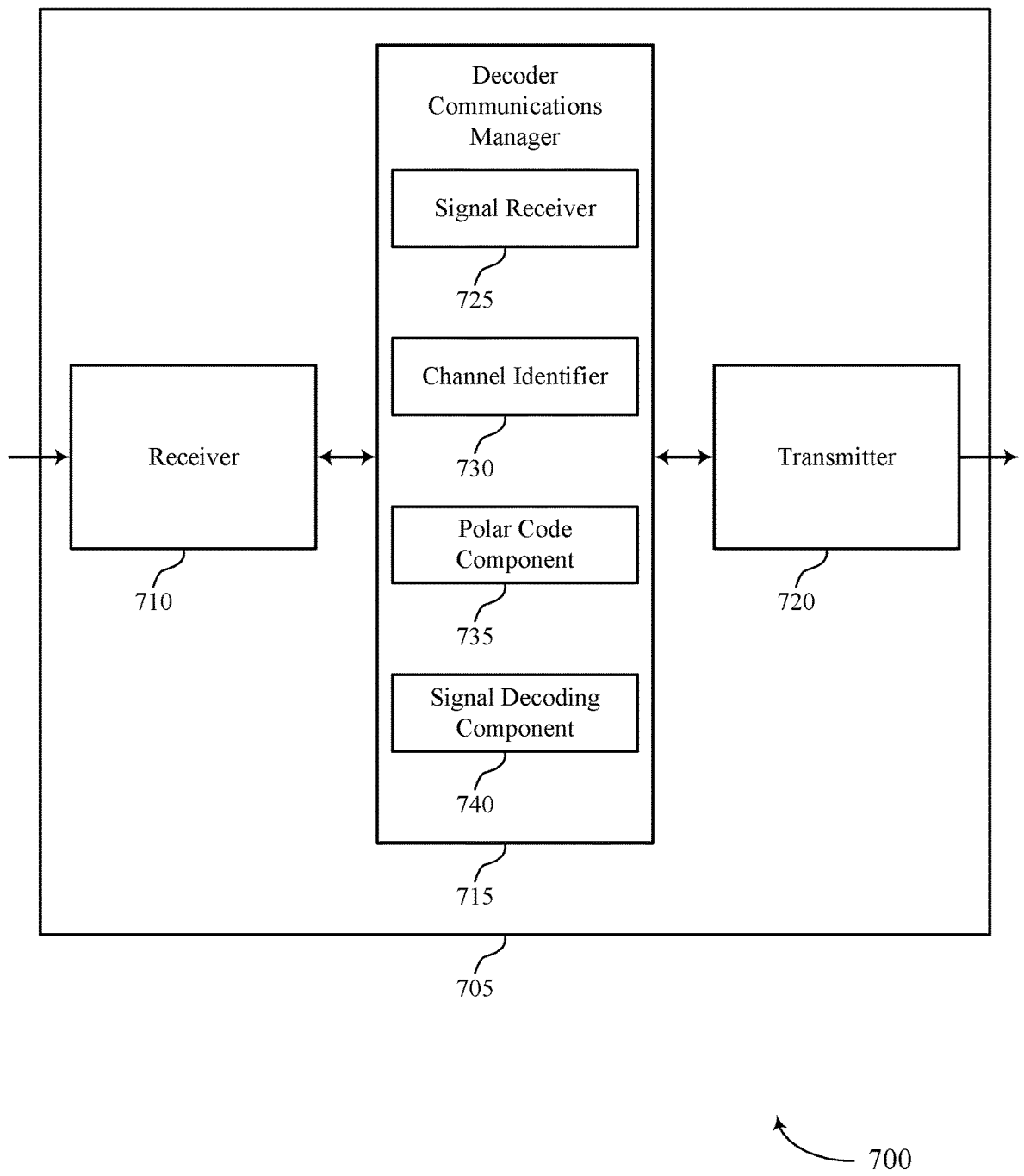

FIG. 7 shows a block diagram 700 of a wireless device 705 that supports enhanced polar code construction in accordance with aspects of the present disclosure. Wireless device 705 may be an example of aspects of a wireless device 605 or a decoder as described with reference to FIG. 6, or wireless device 705 may include a decoder as described herein. Wireless device 705 may include receiver 710, decoder communications manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to enhanced polar code construction, etc.). Information may be passed on to other components of the device. The receiver 710 may be an example of aspects of the transceiver 935 described with reference to FIG. 9. The receiver 710 may utilize a single antenna or a set of antennas.

Decoder communications manager 715 may be an example of aspects of the decoder communications manager 915 described with reference to FIG. 9. Decoder communications manager 715 may also include signal receiver 725, channel identifier 730, polar code component 735, and signal decoding component 740.

Signal receiver 725 may receive a signal representing a codeword over a wireless channel, the codeword being encoded using a polar code of a given code length. Channel identifier 730 may identify, in the signal, unpunctured bit-channels of the codeword.

Polar code component 735 may identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function and determine the initial capacity for the mutual information transfer function based on a sum of a rate of the polar code and the capacity backoff function evaluated for the rate of the polar code and a number of the unpunctured bit-channels of the codeword.

In some cases, the first bit-channel sub-blocks include base sub-blocks and the number of delta bits for one of the first bit-channel sub-blocks is determined based on a ratio of the capacity backoff function for one of the first bit-channel sub-blocks to a sum of the capacity backoff function over all of the first bit-channel sub-blocks. In some cases, the number of information bits is divided into the partitions allocated to the first bit-channel sub-blocks in proportion to a ratio between respective modified capacities of the first bit-channel sub-blocks, the respective modified capacity of one of the first bit-channel sub-blocks determined based on a difference between an aggregate capacity of the one of the first bit-channel sub-blocks and the respective number of delta bits for the one of the first bit-channel sub-blocks. In some cases, the partitions of the information bits assigned to the first bit-channel sub-blocks may be assigned to bit-channels of the first bit-channel sub-blocks in a predetermined order.

In some cases, the capacity backoff function is a closed-form function. In some cases, a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks. In some cases, the set of bit locations of the polar code used for information bits for the encoding is identified based on a table that indicates information bit allocations for at least one of different lengths of the polar code, different numbers of information bits, different numbers of punctured bits, or different BLER target values.

Signal decoding component 740 may decode the signal according to the polar code to obtain an information bit vector at the set of bit locations.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
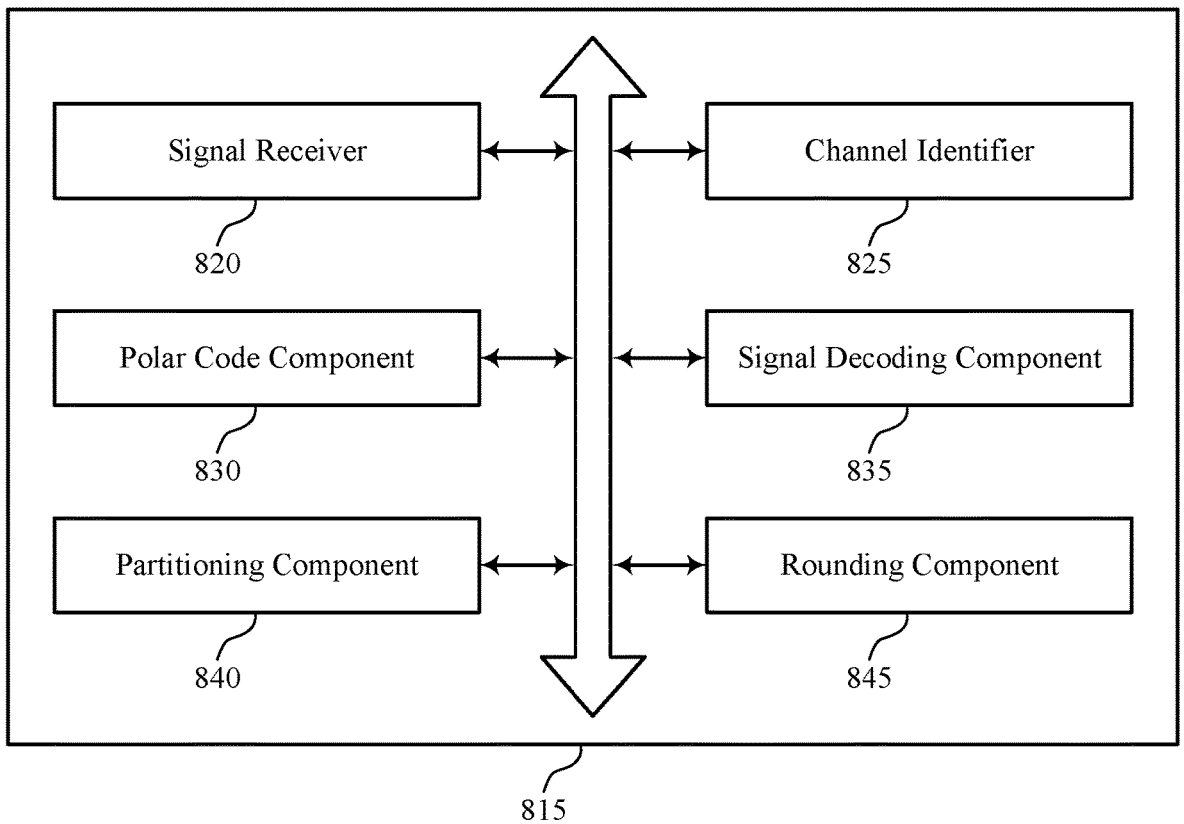

FIG. 8 shows a block diagram 800 of a decoder communications manager 815 that supports enhanced polar code construction in accordance with aspects of the present disclosure. The decoder communications manager 815 may be an example of aspects of a decoder communications manager 615, a decoder communications manager 715, or a decoder communications manager 915 described with reference to FIGS. 6, 7, and 9. The decoder communications manager 815 may include signal receiver 820, channel identifier 825, polar code component 830, signal decoding component 835, partitioning component 840, and rounding component 845. Each of these modules may communicate, directly or indirectly, with one another (e.g., via one or more buses).

Signal receiver 820 may receive a signal representing a codeword over a wireless channel, the codeword encoded using a polar code having a code length. Channel identifier 825 may identify, in the signal, unpunctured bit-channels of the codeword.

Polar code component 830 may identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function and determine the initial capacity for the mutual information transfer function based on a sum of a rate of the polar code and the capacity backoff function evaluated for one or more of the rate of the polar code, a number of the unpunctured bit-channels of the codeword, or BLER.

In some cases, the first bit-channel sub-blocks include base sub-blocks and the number of delta bits for one of the first bit-channel sub-blocks is determined based on a ratio of the capacity backoff function for the one of the first bit-channel sub-blocks to a sum of the capacity backoff function over all of the first bit-channel sub-blocks. In some cases, the number of information bits is divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks. In some cases, the partitions of the information bits assigned to the first bit-channel sub-blocks are assigned to bit-channels of the first bit-channel sub-blocks in a predetermined order.

In some cases, the capacity backoff function is a closed-form function. In some cases, a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks. In some cases, the set of bit locations of the polar code used for information bits for the encoding is identified based on a table that indicates information bit allocations for at least one of different lengths of the polar code, different numbers of information bits, different numbers of punctured bits, or different BLER target values.

Signal decoding component 835 may decode the signal according to the polar code to obtain an information bit vector at the set of bit locations.

Partitioning component 840 may recursively partition each of the partitions allocated to each of the first bit-channel sub-blocks into sub-partitions allocated to second bit-channel sub-blocks of the first bit-channel sub-blocks based on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and where the respective second numbers of delta bits for each of the second bit-channel sub-blocks are based on the capacity backoff function and round the sub-partitions of a partition allocated to one of the first bit-channel sub-blocks to integer values having a sum equal to the number of information bits in the partition.

Rounding component 845 may sequentially round each of the partitions of the number of information bits allocated to each of the first bit-channel sub-blocks, propagate a rounding error from each of the sequentially rounded partitions to a next partition for the sequentially rounding, and recursively round aggregates of the partitions of the number of information bits from an initial polarization stage of the polar code to a polarization stage of the polar code associated with the base sub-blocks. In some cases, a sequence for the sequentially rounding includes a permutation of sub-block indices for the first bit-channel sub-blocks that determines an order of the sequentially rounding.

Figure 9:
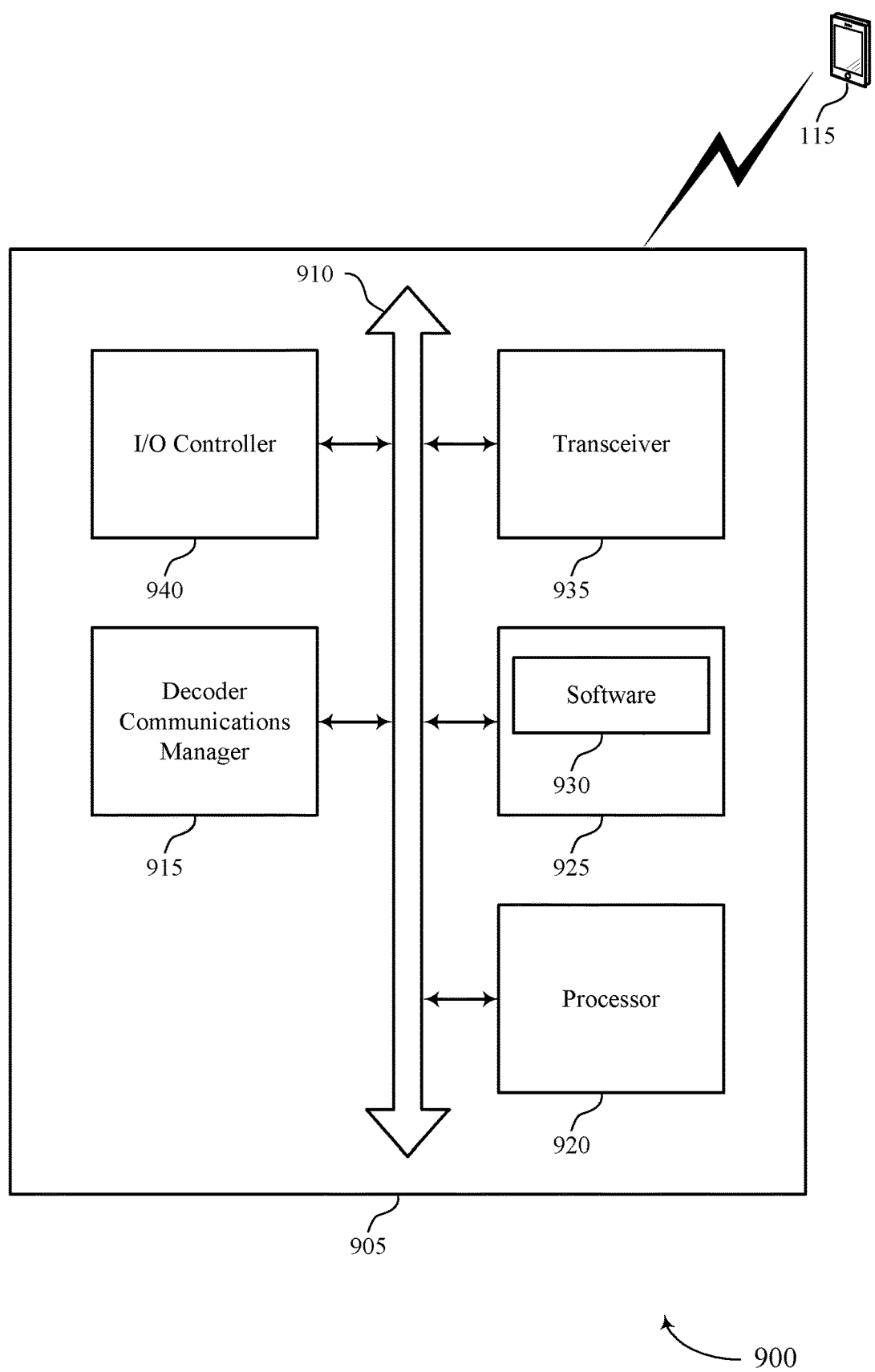
FIG. 9 illustrates a block diagram of a system including a decoder that supports enhanced polar code construction in accordance with aspects of the present disclosure.

FIG. 9 shows a diagram of a system 900 including a device 905 that supports enhanced polar code construction in accordance with aspects of the present disclosure. Device 905 may be an example of or include the components of wireless device 605, wireless device 705, or a decoder as described herein, e.g., with reference to FIGS. 6 and 7. Device 905 may include components for bi-directional voice and data communications including components for transmitting and receiving communications, including decoder communications manager 915, processor 920, memory 925, software 930, transceiver 935, and I/O controller 940. These components may be in electronic communication via one or more buses (e.g., bus 910).

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting enhanced polar code construction).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware or software operation such as the interaction with peripheral components or devices.

Software 930 may include code to implement aspects of the present disclosure, including code to support enhanced polar code construction. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described herein. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

I/O controller 940 may manage input and output signals for device 905. I/O controller 940 may also manage peripherals not integrated into device 905. In some cases, I/O controller 940 may represent a physical connection or port to an external peripheral. In some cases, I/O controller 940 may utilize an operating system such as iOS®, ANDROID®, MS-DOS®, MS-WINDOWS®, OS/2®, UNIX®, LINUX®, or another known operating system. In other cases, I/O controller 940 may represent or interact with a modem, a keyboard, a mouse, a touchscreen, or a similar device. In some cases, I/O controller 940 may be implemented as part of a processor. In some cases, a user may interact with device 905 via I/O controller 940 or via hardware components controlled by I/O controller 940.

Figure 10:
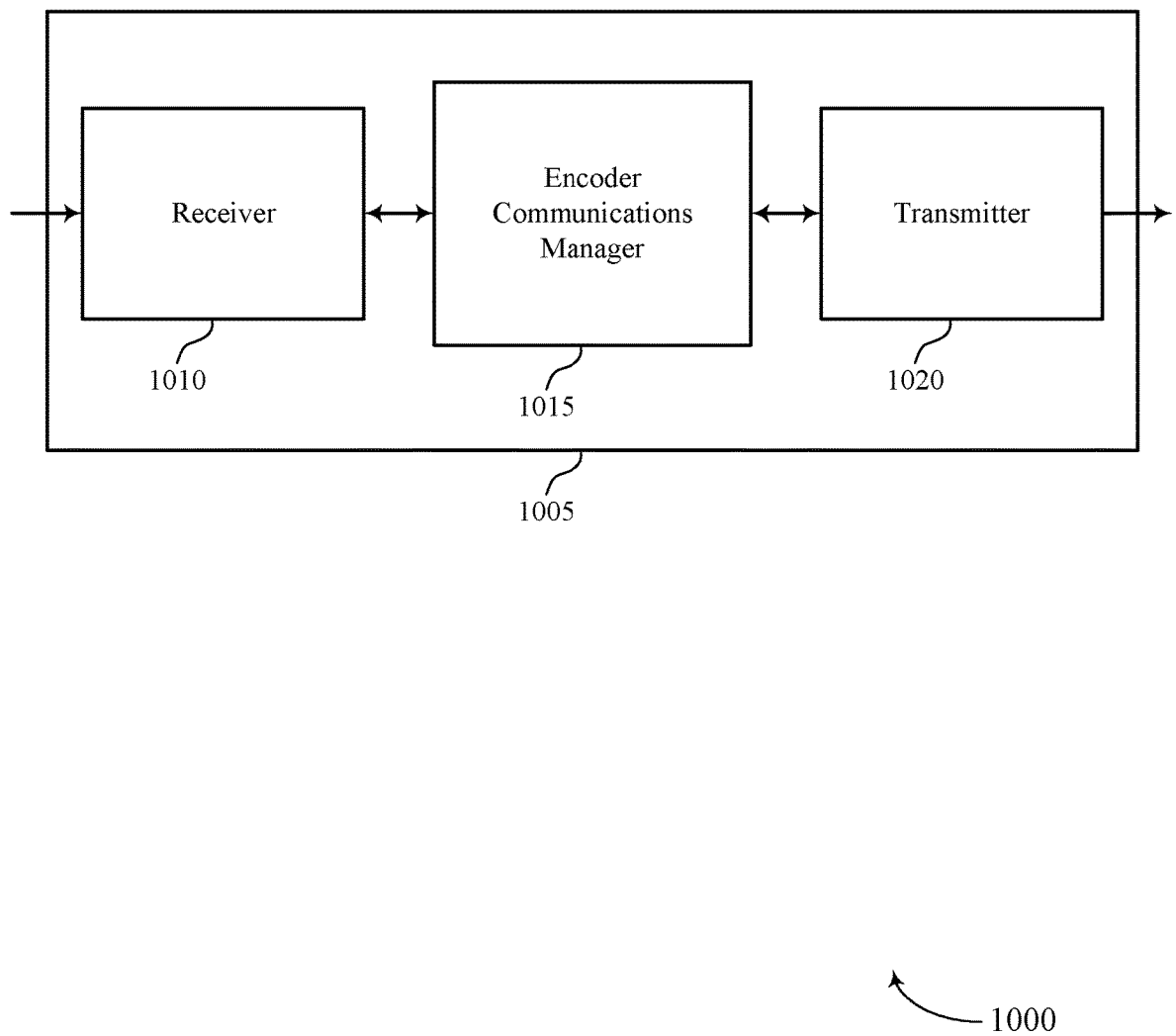
FIGS. 10 through 12 show block diagrams of a device that supports enhanced polar code construction in accordance with aspects of the present disclosure.

FIG. 10 shows a block diagram 1000 of a wireless device 1005 that supports enhanced polar code construction in accordance with aspects of the present disclosure. Wireless device 1005 may be an example of aspects of an encoder, or the wireless device 1005 may include an encoder as described herein. Wireless device 1005 may include receiver 1010, encoder communications manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to enhanced polar code construction, etc.). Information may be passed on to other components of the device. The receiver 1010 may be an example of aspects of the transceiver 1335 described with reference to FIG. 13. The receiver 1010 may utilize a single antenna or a set of antennas.

Encoder communications manager 1015 may be an example of aspects of the encoder communications manager 1315 described with reference to FIG. 13.

Encoder communications manager 1015 and/or at least some of its various sub-components may be implemented in hardware, software executed by a processor, firmware, or any combination thereof. If implemented in software executed by a processor, the functions of the encoder communications manager 1015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The encoder communications manager 1015 and/or at least some of its various sub-components may be physically located at various positions, including being distributed such that portions of functions are implemented at different physical locations by one or more physical devices. In some examples, encoder communications manager 1015 and/or at least some of its various sub-components may be a separate and distinct component in accordance with various aspects of the present disclosure. In other examples, encoder communications manager 1015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Encoder communications manager 1015 may identify an information bit vector for encoding using a polar code to obtain a codeword, identify unpunctured bit-channels of the codeword, identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function, encode the information bit vector mapped to the set of bit locations using the polar code to obtain the codeword, and transmit the codeword over a wireless channel.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1335 described with reference to FIG. 13. The transmitter 1020 may utilize a single antenna or a set of antennas.

Figure 11:
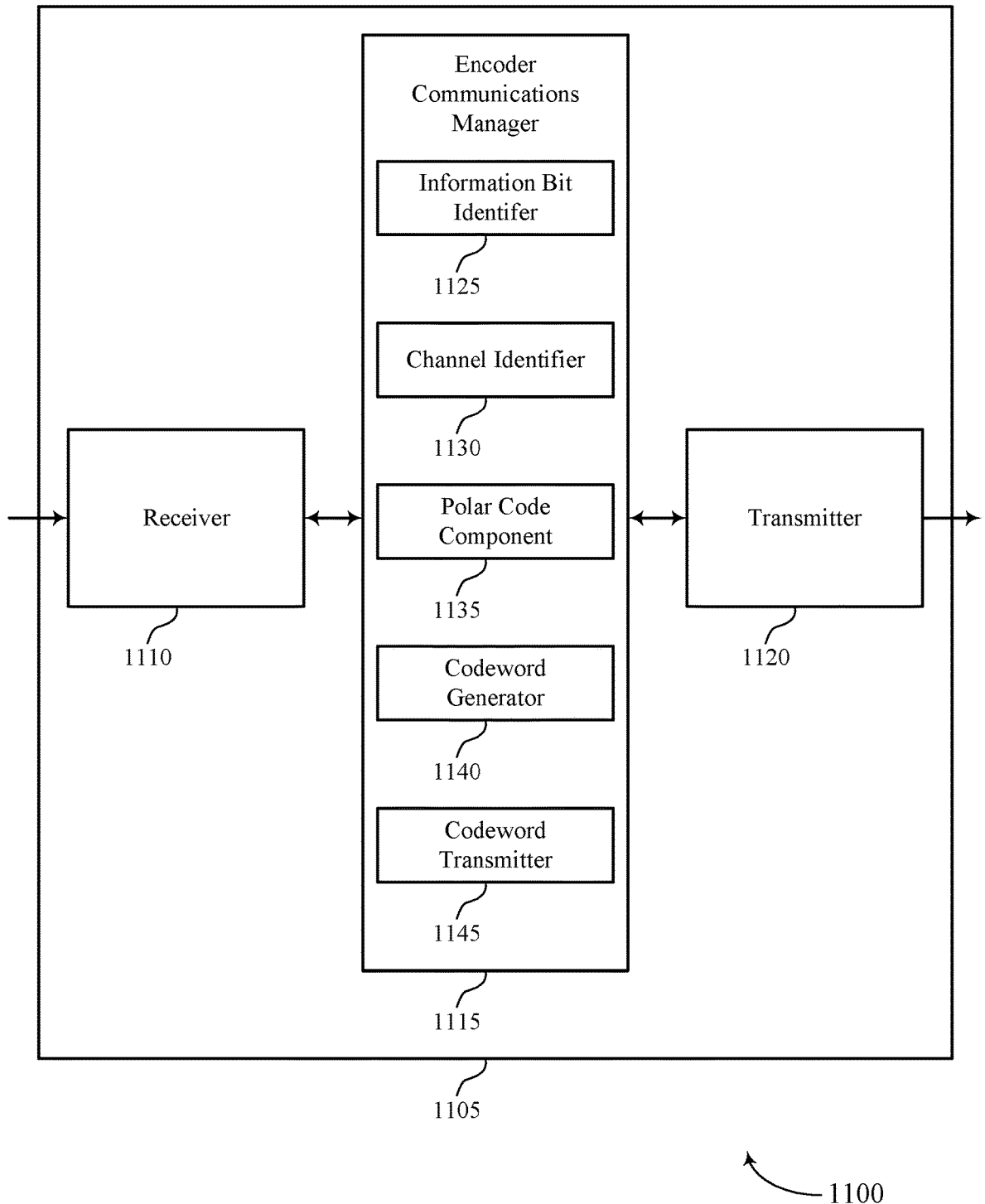

FIG. 11 shows a block diagram 1100 of a wireless device 1105 that supports enhanced polar code construction in accordance with aspects of the present disclosure. Wireless device 1105 may be an example of aspects of a wireless device 1005 or an encoder as described with reference to FIG. 10. Wireless device 1105 may include receiver 1110, encoder communications manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to enhanced polar code construction, etc.). Information may be passed on to other components of the device. The receiver 1110 may be an example of aspects of the transceiver 1335 described with reference to FIG. 13. The receiver 1110 may utilize a single antenna or a set of antennas.

Encoder communications manager 1115 may be an example of aspects of the encoder communications manager 1315 described with reference to FIG. 13.

Encoder communications manager 1115 may also include information bit identifier 1125, channel identifier 1130, polar code component 1135, codeword generator 1140, and codeword transmitter 1145.

Information bit identifier 1125 may identify an information bit vector for encoding using a polar code to obtain a codeword.

Channel identifier 1130 may identify unpunctured bit-channels of the codeword.

Polar code component 1135 may identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function and determine the initial capacity for the mutual information transfer function based on a sum of a rate of the polar code and the capacity backoff function evaluated for one or more of the rate of the polar code, a number of the unpunctured bit-channels of the codeword, or BLER.

In some cases, the first bit-channel sub-blocks include base sub-blocks and the number of delta bits for one of the first bit-channel sub-blocks is determined based on a ratio of the capacity backoff function for the one of the first bit-channel sub-blocks to a sum of the capacity backoff function over all of the first bit-channel sub-blocks. In some cases, the number of information bits is divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks. In some cases, the partitions of the information bits assigned to the first bit-channel sub-blocks are assigned to bit-channels of the first bit-channel sub-blocks in a predetermined order.

In some cases, the capacity backoff function is a closed-form function. In some cases, a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks. In some cases, the set of bit locations of the polar code used for information bits for the encoding is identified based on a table that indicates information bit allocations for at least one of different lengths of the polar code, different numbers of information bits, different numbers of punctured bits, or different BLER target values.

Codeword generator 1140 may encode the information bit vector mapped to the set of bit locations using the polar code to obtain the codeword. Codeword transmitter 1145 may transmit the codeword over a wireless channel.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Figure 12:
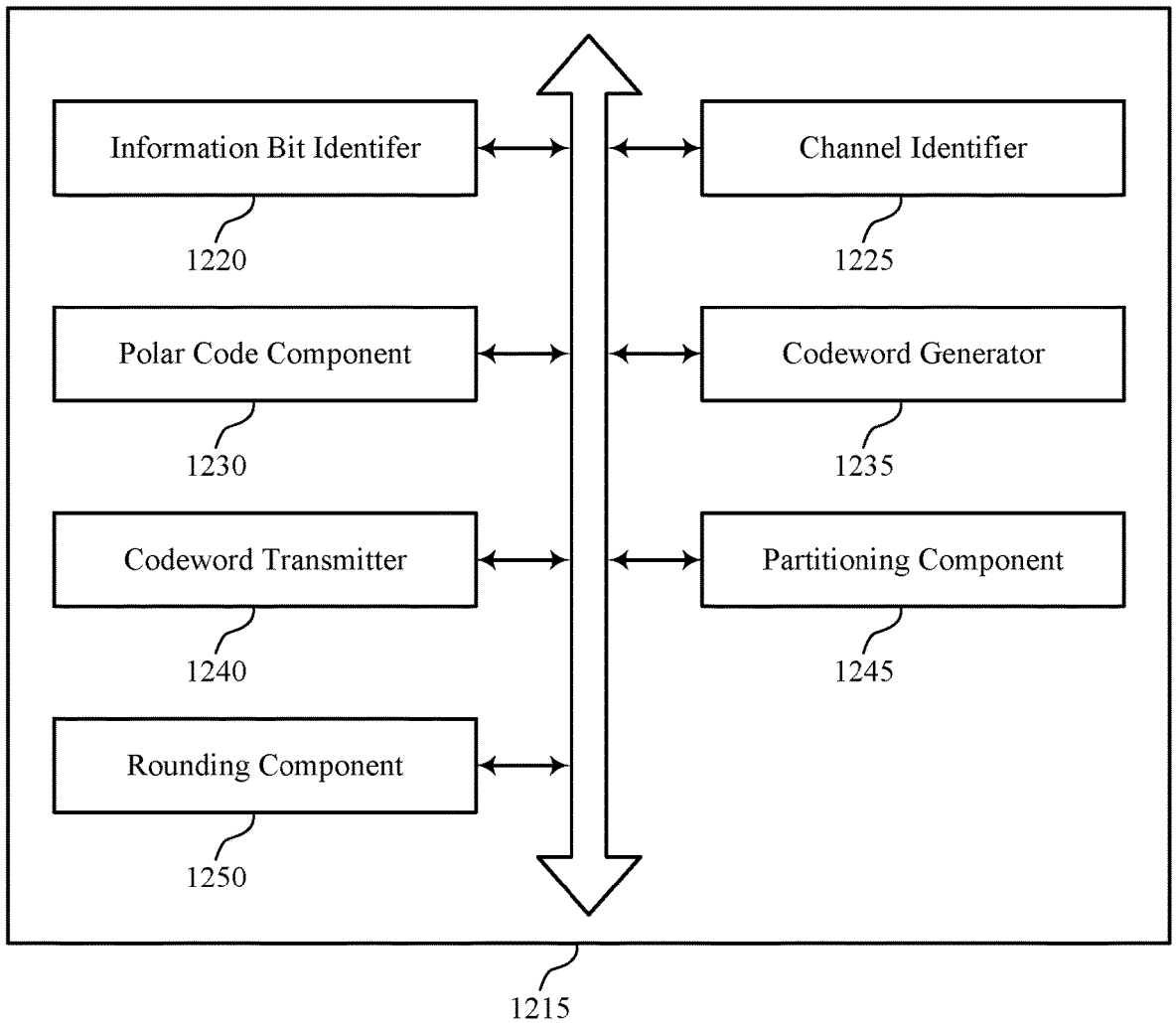

FIG. 12 shows a block diagram 1200 of an encoder communications manager 1215 that supports enhanced polar code construction in accordance with aspects of the present disclosure. The encoder communications manager 1215 may be an example of aspects of an encoder communications manager 1315 described with reference to FIGS. 10, 11, and 13. The encoder communications manager 1215 may include information bit identifier 1220, channel identifier 1225, polar code component 1230, codeword generator 1235, codeword transmitter 1240, partitioning component 1245, and rounding component 1250. Each of these modules may communicate, directly or indirectly, with one another (e.g., via one or more buses).

Information bit identifier 1220 may identify an information bit vector for encoding using a polar code to obtain a codeword. Channel identifier 1225 may identify unpunctured bit-channels of the codeword.

Polar code component 1230 may identify a set of bit locations of the polar code used for information bits for the encoding, where the set of bit locations is determined based on dividing a number of the information bits into partitions allocated to first bit-channel sub-blocks for at least one stage of polarization of the polar code, where the partitioning is based on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based on a capacity backoff function and determine the initial capacity for the mutual information transfer function based on a sum of a rate of the polar code and the capacity backoff function evaluated for one or more of the rate of the polar code, a number of the unpunctured bit-channels of the codeword, or BLER.

In some cases, the first bit-channel sub-blocks include base sub-blocks and the number of delta bits for one of the first bit-channel sub-blocks is determined based on a ratio of the capacity backoff function for the one of the first bit-channel sub-blocks to a sum of the capacity backoff function over all of the first bit-channel sub-blocks. In some cases, the number of information bits is divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks. In some cases, the partitions of the information bits assigned to the first bit-channel sub-blocks are assigned to bit-channels of the first bit-channel sub-blocks in a predetermined order.

In some examples, the capacity backoff function may be a closed-form function. In some cases, a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks. In some cases, the set of bit locations of the polar code used for information bits for the encoding is identified based on a table that indicates information bit allocations for at least one of different lengths of the polar code, different numbers of information bits, different numbers of punctured bits, or different BLER target values.

Codeword generator 1235 may encode the information bit vector mapped to the set of bit locations using the polar code to obtain the codeword. Codeword transmitter 1240 may transmit the codeword over a wireless channel.

Partitioning component 1245 may recursively partition each of the partitions allocated to each of the first bit-channel sub-blocks into sub-partitions allocated to second bit-channel sub-blocks of the first bit-channel sub-blocks based on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and where the respective second numbers of delta bits for each of the second bit-channel sub-blocks are based on the capacity backoff function and round the sub-partitions of a partition allocated to one of the first bit-channel sub-blocks to integer values having a sum equal to the number of information bits in the partition.

Rounding component 1250 may sequentially round each of the partitions of the number of information bits allocated to each of the first bit-channel sub-blocks, propagate a rounding error from each of the sequentially rounded partitions to a next partition for the sequentially rounding, and recursively round aggregates of the partitions of the number of information bits from an initial polarization stage of the polar code to a polarization stage of the polar code associated with the base sub-blocks. In some cases, a sequence for the sequentially rounding includes a permutation of sub-block indices for the first bit-channel sub-blocks that determines an order of the sequentially rounding.

Figure 13:
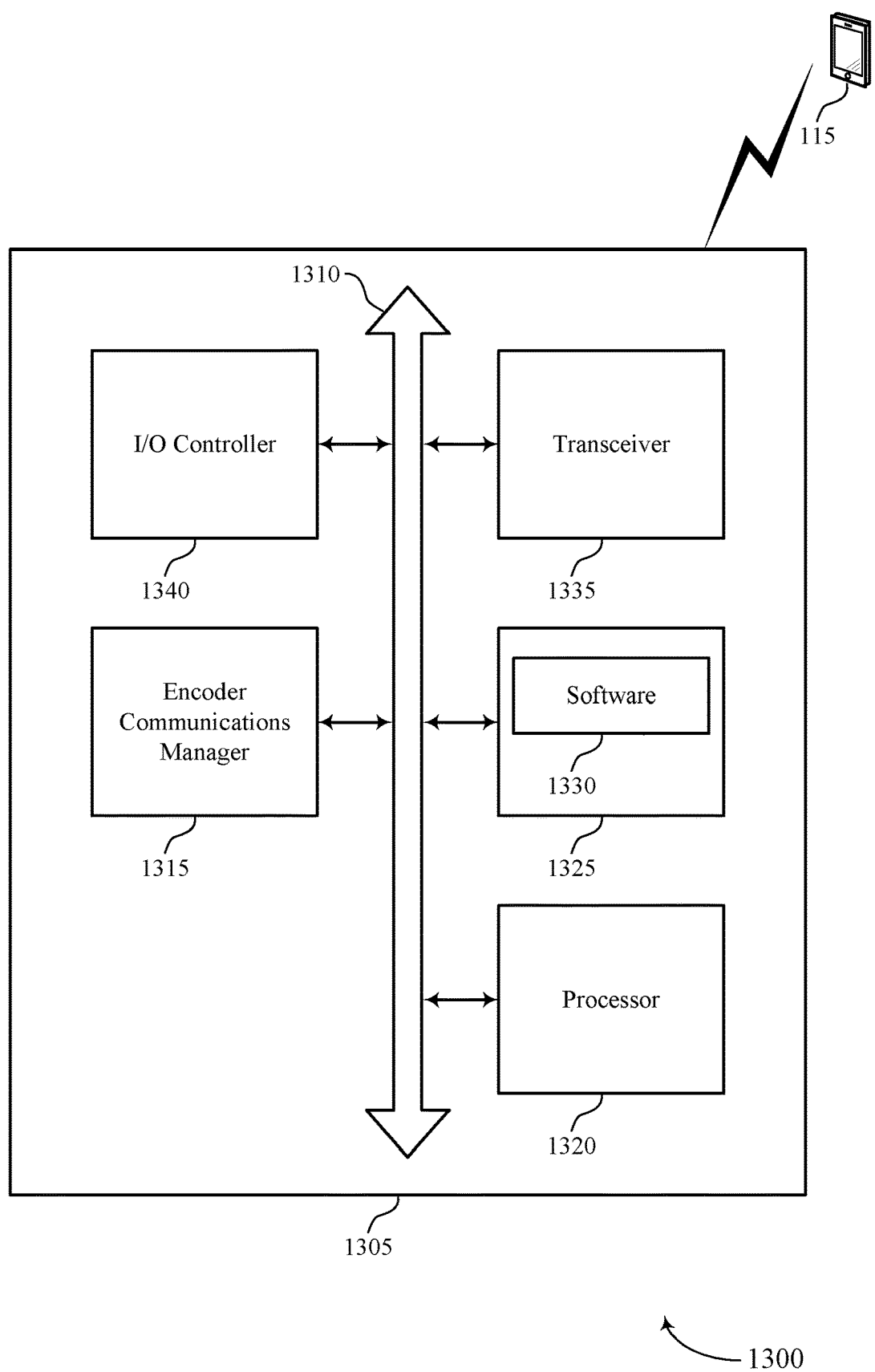
FIG. 13 illustrates a block diagram of a system including an encoder that supports enhanced polar code construction in accordance with aspects of the present disclosure.

FIG. 13 shows a diagram of a system 1300 including a device 1305 that supports enhanced polar code construction in accordance with aspects of the present disclosure. Device 1305 may be an example of an encoder, include an encoder, or include components of an encoder as described herein, e.g., with reference to FIG. 1. Device 1305 may include components for bi-directional voice and data communications including components for transmitting and receiving communications, including encoder communications manager 1315, processor 1320, memory 1325, software 1330, transceiver 1335, and I/O controller 1340. These components may be in electronic communication via one or more buses (e.g., bus 1310).

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting enhanced polar code construction).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware or software operation such as the interaction with peripheral components or devices.

Software 1330 may include code to implement aspects of the present disclosure, including code to support enhanced polar code construction. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described herein. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

I/O controller 1340 may manage input and output signals for device 1305. I/O controller 1340 may also manage peripherals not integrated into device 1305. In some cases, I/O controller 1340 may represent a physical connection or port to an external peripheral. In some cases, I/O controller 1340 may utilize an operating system such as iOS®, ANDROID®, MS-DOS®, MS-WINDOWS®, OS/2®, UNIX®, LINUX®, or another known operating system. In other cases, I/O controller 1340 may represent or interact with a modem, a keyboard, a mouse, a touchscreen, or a similar device. In some cases, I/O controller 1340 may be implemented as part of a processor. In some cases, a user may interact with device 1305 via I/O controller 1340 or via hardware components controlled by I/O controller 1340.

Figure 14:
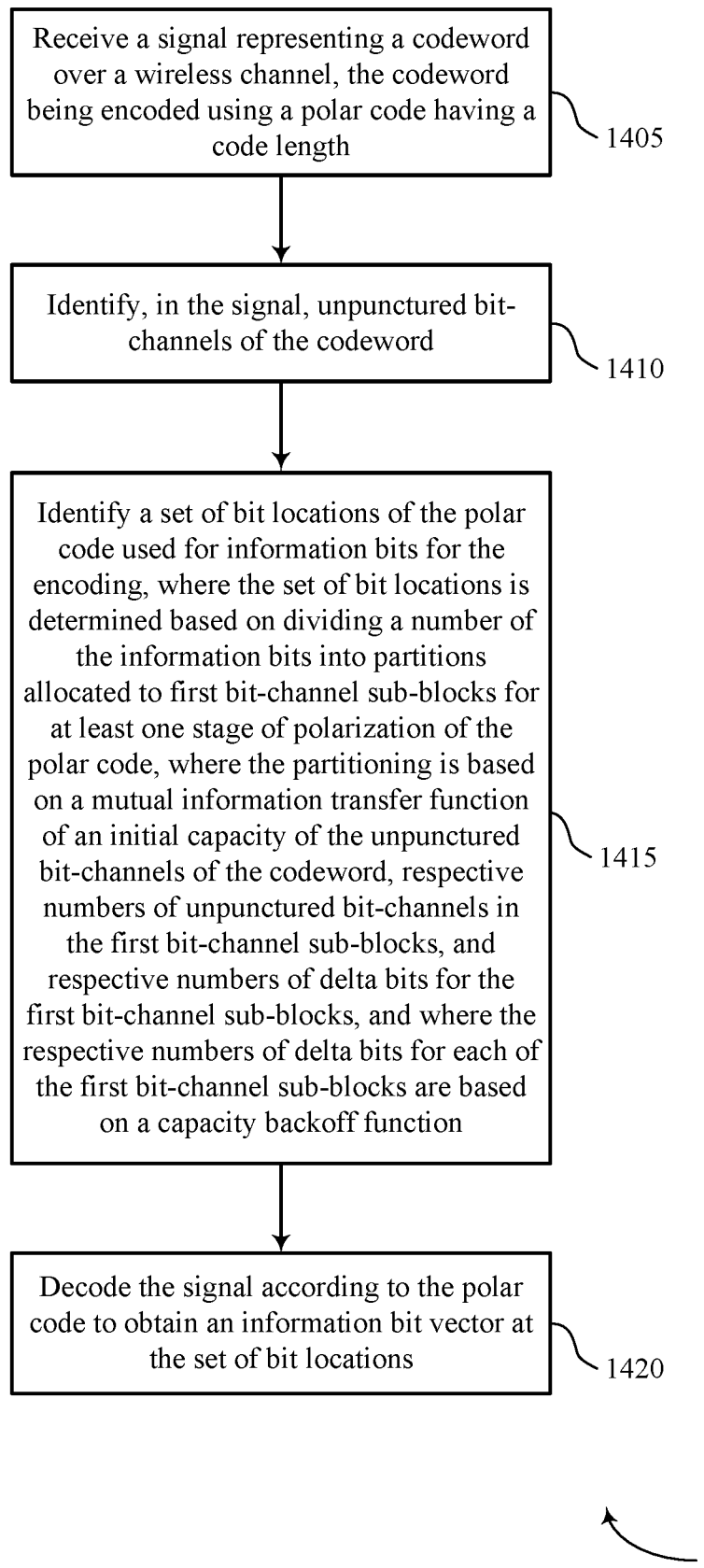
FIGS. 14 through 15 illustrate methods for enhanced polar code construction in accordance with aspects of the present disclosure.

FIG. 14 shows a flowchart illustrating a method 1400 for enhanced polar code construction in accordance with aspects of the present disclosure. The operations of method 1400 may be implemented by a decoder of a wireless device or its components as described herein. For example, the operations of method 1400 may be performed by a decoder communications manager as described with reference to FIGS. 6 through 9. In some examples, a decoder may execute a set of codes to control the functional elements of the device to perform the functions described herein. Additionally or alternatively, the decoder may perform aspects of the functions described herein using special-purpose hardware.

At 1405 the decoder may receive a signal representing a codeword over a wireless channel, the codeword being encoded using a polar code having a code length. The operations of 1405 may be performed according to the methods described herein. In certain examples, aspects of the operations of 1405 may be performed by a signal receiver as described with reference to FIGS. 6 through 9.

At 1410 the decoder may identify, in the signal, unpunctured bit-channels of the codeword. The operations of 1410 may be performed according to the methods described herein. In certain examples, aspects of the operations of 1410 may be performed by a channel identifier as described with reference to FIGS. 6 through 9.

At 1415 the decoder may identify a set of bit locations of the polar code used for information bits for the encoding, where the set of bit locations is determined based at least in part on dividing a number of the information bits into partitions allocated to first bit-channel sub-blocks for at least one stage of polarization of the polar code, where the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based at least in part on a capacity backoff function. The operations of 1415 may be performed according to the methods described herein. In certain examples, aspects of the operations of 1415 may be performed by a polar code component as described with reference to FIGS. 6 through 9.

At 1420 the decoder may decode the signal according to the polar code to obtain an information bit vector at the set of bit locations. The operations of 1420 may be performed according to the methods described herein. In certain examples, aspects of the operations of 1420 may be performed by a signal decoding component as described with reference to FIGS. 6 through 9.

Figure 15:
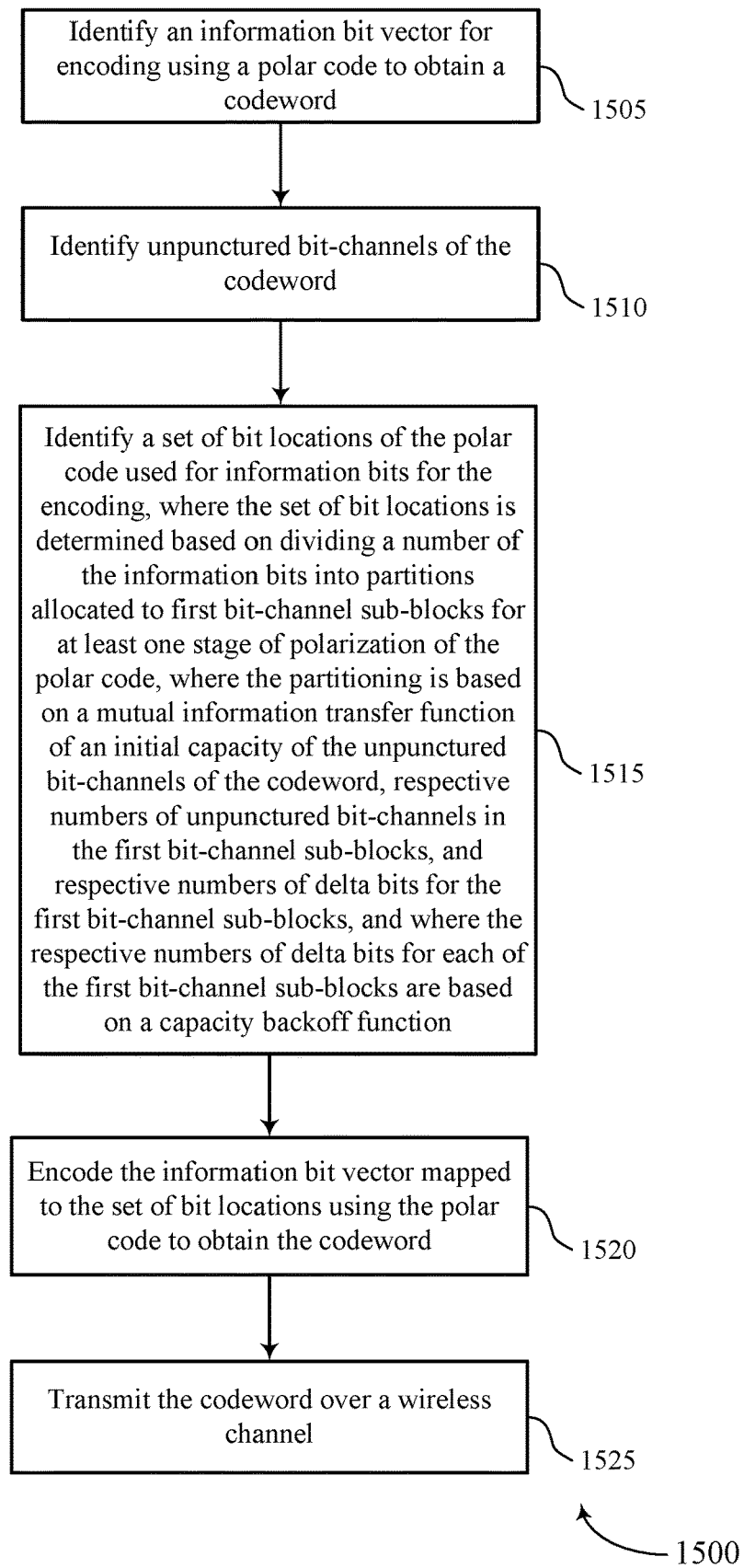

FIG. 15 shows a flowchart illustrating a method 1500 for enhanced polar code construction in accordance with aspects of the present disclosure. The operations of method 1500 may be implemented by an encoder of a wireless device or its components as described herein. For example, the operations of method 1500 may be performed by an encoder communications manager as described with reference to FIGS. 10 through 13. In some examples, an encoder may execute a set of codes to control the functional elements of the device to perform the functions described herein. Additionally or alternatively, the encoder may perform aspects of the functions described herein using special-purpose hardware.

At 1505 the encoder may identify an information bit vector for encoding using a polar code to obtain a codeword. The operations of 1505 may be performed according to the methods described herein. In certain examples, aspects of the operations of 1505 may be performed by an information bit identifier as described with reference to FIGS. 10 through 13.

At 1510 the encoder may identify unpunctured bit-channels of the codeword. The operations of 1510 may be performed according to the methods described herein. In certain examples, aspects of the operations of 1510 may be performed by a channel identifier as described with reference to FIGS. 10 through 13.

At 1515 the encoder may identify a set of bit locations of the polar code used for information bits for the encoding, where the set of bit locations is determined based at least in part on dividing a number of the information bits into partitions allocated to first bit-channel sub-blocks for at least one stage of polarization of the polar code, where the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and where the respective numbers of delta bits for each of the first bit-channel sub-blocks are based at least in part on a capacity backoff function. The operations of 1515 may be performed according to the methods described herein. In certain examples, aspects of the operations of 1515 may be performed by a polar code component as described with reference to FIGS. 10 through 13.

At 1520 the encoder may encode the information bit vector mapped to the set of bit locations using the polar code to obtain the codeword. The operations of 1520 may be performed according to the methods described herein. In certain examples, aspects of the operations of 1520 may be performed by a codeword generator as described with reference to FIGS. 10 through 13.

At 1525 the encoder may transmit the codeword over a wireless channel. The operations of 1525 may be performed according to the methods described herein. In certain examples, aspects of the operations of 1525 may be performed by a codeword transmitter as described with reference to FIGS. 10 through 13.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
  receiving a signal representing a codeword over a wireless channel, the codeword being encoded using a polar code having a code length;
  identifying, in the signal, unpunctured bit-channels of the codeword;
  identifying a set of bit locations of the polar code used for information bits for the encoding, wherein the set of bit locations is determined based at least in part on dividing a number of the information bits into partitions allocated to first bit-channel sub-blocks for at least one stage of polarization of the polar code, wherein the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and wherein the respective numbers of delta bits for each of the first bit-channel sub-blocks are based at least in part on a capacity backoff function; and
  decoding the signal according to the polar code to obtain an information bit vector at the set of bit locations.

2. The method of claim 1, further comprising:
  recursively partitioning each of the partitions allocated to each of the first bit-channel sub-blocks into sub-partitions allocated to second bit-channel sub-blocks of the first bit-channel sub-blocks based at least in part on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and wherein the respective second numbers of delta bits for each of the second bit-channel sub-blocks are based at least in part on the capacity backoff function.

3. The method of claim 2, further comprising:
  rounding the sub-partitions of a partition allocated to one of the first bit-channel sub-blocks to integer values having a sum equal to the number of information bits in the partition.

4. The method of claim 1, wherein the first bit-channel sub-blocks comprise base sub-blocks and the number of delta bits for one of the first bit-channel sub-blocks is determined based at least in part on a ratio of the capacity backoff function for the one of the first bit-channel sub-blocks to a sum of the capacity backoff function over all of the first bit-channel sub-blocks.

5. The method of claim 4, further comprising:
  sequentially rounding each of the partitions of the number of information bits allocated to each of the first bit-channel sub-blocks; and
  propagating a rounding error from each of the sequentially rounded partitions to a next partition for the sequentially rounding.

6. The method of claim 5, wherein a sequence for the sequentially rounding comprises a permutation of sub-block indices for the first bit-channel sub-blocks that determines an order of the sequentially rounding.

7. The method of claim 4, further comprising:
  recursively rounding aggregates of the partitions of the number of information bits from an initial polarization stage of the polar code to a polarization stage of the polar code associated with the base sub-blocks.

8. The method of claim 1, further comprising:
  determining the initial capacity for the mutual information transfer function based on a sum of a rate of the polar code and the capacity backoff function evaluated for the rate of the polar code and a number of the unpunctured bit-channels of the codeword.

9. The method of claim 1, wherein the number of information bits is divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks.

10. The method of claim 1, wherein the partitions of the information bits assigned to the first bit-channel sub-blocks are assigned to bit-channels of the first bit-channel sub-blocks in a predetermined order.

11. The method of claim 1, wherein the capacity backoff function is a closed-form function.

12. The method of claim 1, wherein the capacity backoff function is based at least in part on a block error ratio (BLER) target value.

13. The method of claim 1, wherein a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks.

14. The method of claim 1, wherein the set of bit locations of the polar code used for information bits for the encoding is identified based on a table that indicates information bit allocations for the first bit channel sub-blocks for at least one of:
  different lengths of the polar code, different numbers of information bits, different numbers of punctured bits, or different BLER target values.

15. A method for wireless communication, comprising:
identifying an information bit vector for encoding using a polar code to obtain a codeword;
identifying unpunctured bit-channels of the codeword;
identifying a set of bit locations of the polar code used for information bits for the encoding, wherein the set of bit locations is determined based at least in part on dividing a number of the information bits into partitions allocated to first bit-channel sub-blocks for at least one stage of polarization of the polar code, wherein the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and wherein the respective numbers of delta bits for each of the first bit-channel sub-blocks are based at least in part on a capacity backoff function;
encoding the information bit vector mapped to the set of bit locations using the polar code to obtain the codeword; and
transmitting the codeword over a wireless channel.

16. The method of claim 15, further comprising:
recursively partitioning each of the partitions allocated to each of the first bit-channel sub-blocks into sub-partitions allocated to second bit-channel sub-blocks of the first bit-channel sub-blocks based at least in part on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and wherein the respective second numbers of delta bits for each of the second bit-channel sub-blocks are based at least in part on the capacity backoff function.

17. The method of claim 16, further comprising:
rounding the sub-partitions of a partition allocated to one of the first bit-channel sub-blocks to integer values having a sum equal to the number of information bits in the partition.

18. The method of claim 15, wherein the first bit-channel sub-blocks comprise base sub-blocks and the number of delta bits for one of the first bit-channel sub-blocks is determined based at least in part on a ratio of the capacity backoff function for the one of the first bit-channel sub-blocks to a sum of the capacity backoff function over all of the first bit-channel sub-blocks.

19. The method of claim 18, further comprising:
sequentially rounding each of the partitions of the number of information bits allocated to each of the first bit-channel sub-blocks; and
propagating a rounding error from each of the sequentially rounded partitions to a next partition for the sequentially rounding.

20. The method of claim 19, wherein a sequence for the sequentially rounding comprises a permutation of sub-block indices for the first bit-channel sub-blocks that determines an order of the sequentially rounding.

21. The method of claim 18, further comprising:
recursively rounding aggregates of the partitions of the number of information bits from an initial polarization stage of the polar code to a polarization stage of the polar code associated with the base sub-blocks.

22. The method of claim 15, further comprising:
determining the initial capacity for the mutual information transfer function based on a sum of a rate of the polar code and the capacity backoff function evaluated for the rate of the polar code and a number of the unpunctured bit-channels of the codeword.

23. The method of claim 15, wherein the number of information bits is divided into the partitions allocated to the first bit-channel sub-blocks in proportion to a ratio between respective modified capacities of the first bit-channel sub-blocks, the respective modified capacity of one of the first bit-channel sub-blocks being determined based on a difference between an aggregate capacity of the one of the first bit-channel sub-blocks and the respective number of delta bits for the one of the first bit-channel sub-blocks.

24. The method of claim 15, wherein the partitions of the information bits assigned to the first bit-channel sub-blocks are assigned to bit-channels of the first bit-channel sub-blocks in a predetermined order.

25. The method of claim 15, wherein the capacity backoff function is a closed-form function.

26. The method of claim 15, wherein a ratio of the respective numbers of delta bits for the first bit-channel sub-blocks is proportional to the capacity backoff function evaluated for the first bit-channel sub-blocks over the respective numbers of unpunctured bit locations in the first bit-channel sub-blocks and the respective aggregate capacities of the first bit-channel sub-blocks.

27. The method of claim 15, wherein the set of bit locations of the polar code used for information bits for the encoding is identified based on a table that indicates information bit allocations for the first bit channel sub-blocks for at least one of:
different lengths of the polar code, different numbers of information bits, different numbers of punctured bits, or different BLER target values.

28. An apparatus for wireless communication, comprising:
a processor;
memory in electronic communication with the processor; and
instructions stored in the memory and executable by the processor to cause the apparatus to:
receive a signal representing a codeword over a wireless channel, the codeword being encoded using a polar code having a code length;
identify, in the signal, unpunctured bit-channels of the codeword;
identify a set of bit locations of the polar code used for information bits for the encoding, wherein the set of bit locations is determined based at least in part on dividing a number of the information bits into partitions allocated to first bit-channel sub-blocks for at least one stage of polarization of the polar code, wherein the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and wherein the respective numbers of delta bits for each of the first bit-channel sub-blocks are based at least in part on a capacity backoff function; and
decode the signal according to the polar code to obtain an information bit vector at the set of bit locations.

29. The apparatus of claim 28, wherein the instructions are executable by the processor to cause the apparatus to:

recursively partition each of the partitions allocated to each of the first bit-channel sub-blocks into sub-partitions allocated to second bit-channel sub-blocks of the first bit-channel sub-blocks based at least in part on the mutual information transfer function of respective normalized capacities of the first bit-channel sub-blocks, respective second numbers of unpunctured bit locations in the second bit-channel sub-blocks, and respective second numbers of delta bits for the second bit-channel sub-blocks, and wherein the respective second numbers of delta bits for each of the second bit-channel sub-blocks are based at least in part on the capacity backoff function.

30. An apparatus for wireless communication, comprising:

a processor;

memory in electronic communication with the processor; and instructions stored in the memory and executable by the processor to cause the apparatus to:

identify an information bit vector for encoding using a polar code to obtain a codeword;

identify unpunctured bit-channels of the codeword;

identify a set of bit locations of the polar code used for information bits for the encoding, wherein the set of bit locations is determined based at least in part on dividing a number of the information bits into partitions allocated to first bit-channel sub-blocks for at least one stage of polarization of the polar code, wherein the partitioning is based at least in part on a mutual information transfer function of an initial capacity of the unpunctured bit-channels of the codeword, respective numbers of unpunctured bit-channels in the first bit-channel sub-blocks, and respective numbers of delta bits for the first bit-channel sub-blocks, and wherein the respective numbers of delta bits for each of the first bit-channel sub-blocks are based at least in part on a capacity backoff function;

encode the information bit vector mapped to the set of bit locations using the polar code to obtain the codeword; and transmit the codeword over a wireless channel.

31. An apparatus for wireless communication produced according to a method, the method comprising:

providing a processor within the apparatus;

providing a memory within the apparatus, the memory in electronic communication with the processor;

determining a set of bit locations for information bits for a polar code having a code length based at least in part on dividing a number of the information bits into partitions allocated to first bit-channel sub-blocks for at least one stage of polarization of the polar code, wherein the partitioning is based at least in part on a mutual information transfer function of an initial capacity of unpunctured bit-channels of a codeword, respective numbers of unpunctured bit-channels in the first bit-channel sub-blocks, and respective numbers of delta bits for the first bit-channel sub-blocks, and wherein the respective numbers of delta bits for each of the first bit-channel sub-blocks are based at least in part on a capacity backoff function;

inserting a data structure comprising the set of bit locations into the memory of the apparatus; and inserting instructions into the memory, the instructions executable by the processor to cause the apparatus to:

receive a signal representing the codeword over a wireless channel, the codeword being encoded using the polar code;

identify, in the signal, the unpunctured bit-channels of the codeword;

identify the set of bit locations of the polar code used for the information bits for the encoding based at least in part on the data structure and the unpunctured bit-channels of the codeword; and decode the signal according to the polar code to obtain an information bit vector at the set of bit locations.

* * * * *